US011610822B2

(12) United States Patent
Chen et al.

(10) Patent No.: US 11,610,822 B2
(45) Date of Patent: Mar. 21, 2023

(54) STRUCTURES FOR TUNING THRESHOLD VOLTAGE

(71) Applicant: Taiwan Semiconductor Manufacturing Co., Ltd., Hsin-Chu (TW)

(72) Inventors: Yen-Yu Chen, Taichung (TW); Chung-Liang Cheng, Changhua County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/925,893

(22) Filed: Jul. 10, 2020

(65) Prior Publication Data

US 2021/0242092 A1 Aug. 5, 2021

Related U.S. Application Data

(60) Provisional application No. 62/968,482, filed on Jan. 31, 2020.

(51) Int. Cl.
*H01L 21/8238* (2006.01)
*H01L 27/092* (2006.01)
(Continued)

(52) U.S. Cl.
CPC .. *H01L 21/823857* (2013.01); *H01L 21/0337* (2013.01); *H01L 21/823821* (2013.01); *H01L 21/823828* (2013.01); *H01L 27/0922* (2013.01); *H01L 29/0673* (2013.01); *H01L 29/4966* (2013.01); *H01L 29/7851* (2013.01)

(58) Field of Classification Search
CPC . H01L 27/088; H01L 27/092; H01L 27/0922; H01L 29/775; H01L 29/785; H01L 29/7851; H01L 29/4966; H01L 29/0673; H01L 29/66795; H01L 21/823857; H01L 21/823462; H01L 21/823842; H01L 21/823821; H01L 21/0337
See application file for complete search history.

(56) References Cited

U.S. PATENT DOCUMENTS 8,796,666 B1 8/2014 Huang et al.
8,815,712 B2 8/2014 Wan et al.
(Continued)

FOREIGN PATENT DOCUMENTS

DE 112011101277 B4 8/2016
JP 2010272782 A 12/2010
(Continued)

*Primary Examiner* — Michael M Trinh
(74) *Attorney, Agent, or Firm* — Haynes and Boone, LLP

(57) ABSTRACT

A semiconductor device includes a first gate structure that includes a first interfacial layer, a first gate dielectric layer disposed over the first interfacial layer, and a first gate electrode disposed over the first gate dielectric layer. The semiconductor device also includes a second gate structure that includes a second interfacial layer, a second gate dielectric layer disposed over the second interfacial layer, and a second gate electrode disposed over the second gate dielectric layer. The first interfacial layer contains a different amount of a dipole material than the second interfacial layer.

20 Claims, 44 Drawing Sheets

(51) Int. Cl.
    *H01L 29/49*     (2006.01)
    *H01L 29/78*     (2006.01)
    *H01L 29/06*     (2006.01)
    *H01L 21/033*     (2006.01)

(56) References Cited

U.S. PATENT DOCUMENTS

| | | |
|---|---|---|
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,962,400 B2 | 2/2015 | Tsai et al. |
| 8,963,258 B2 | 2/2015 | Yu et al. |
| 9,093,514 B2 | 7/2015 | Tsai et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,245,805 B2 | 1/2016 | Yeh et al. |
| 9,520,482 B1 | 12/2016 | Chang et al. |
| 9,548,303 B2 | 1/2017 | Lee et al. |
| 9,576,814 B2 | 2/2017 | Wu et al. |
| 10,304,835 B1 * | 5/2019 | Tsai .................. H01L 21/823821 |
| 2011/0108924 A1 * | 5/2011 | Suzuki ............ H01L 21/823842 257/369 |
| 2011/0127616 A1 | 6/2011 | Hoentschel et al. |
| 2012/0049297 A1 * | 3/2012 | Takeoka .......... H01L 21/823462 257/410 |
| 2012/0228715 A1 * | 9/2012 | Niimi .............. H01L 21/823842 257/369 |
| 2013/0285116 A1 | 10/2013 | Lochtefeld et al. |
| 2014/0242790 A1 | 8/2014 | Harada et al. |
| 2014/0264626 A1 | 9/2014 | Yan et al. |
| 2015/0035073 A1 * | 2/2015 | Ando .................... H01L 29/513 438/783 |
| 2015/0104933 A1 | 4/2015 | Tsai et al. |
| 2016/0155748 A1 | 6/2016 | Li et al. |
| 2017/0162686 A1 * | 6/2017 | Arimura ............... H01L 29/512 |
| 2018/0090561 A1 * | 3/2018 | Lin .................... H01L 21/28264 |
| 2019/0318967 A1 | 10/2019 | Chen et al. |
| 2019/0333826 A1 | 10/2019 | Huang et al. |
| 2019/0348530 A1 | 11/2019 | Ando et al. |
| 2020/0119164 A1 * | 4/2020 | Tsau .................. H01L 29/42392 |

FOREIGN PATENT DOCUMENTS

| | | |
|---|---|---|
| JP | 2015046505 A | 3/2015 |
| KR | 20150051445 A | 5/2015 |
| KR | 20160095399 A | 8/2016 |
| KR | 20190031855 A | 3/2019 |
| TW | 201917883 A | 5/2019 |

\* cited by examiner

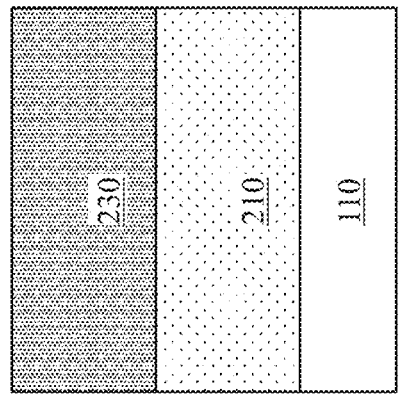
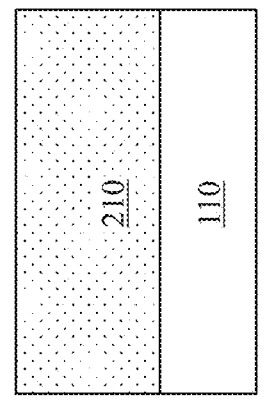
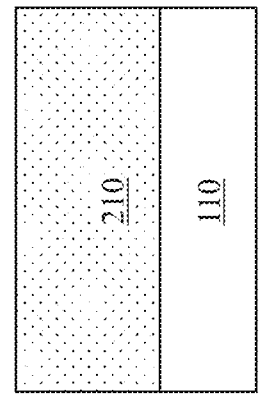

N-SVT

N-LVT

N-uLVT

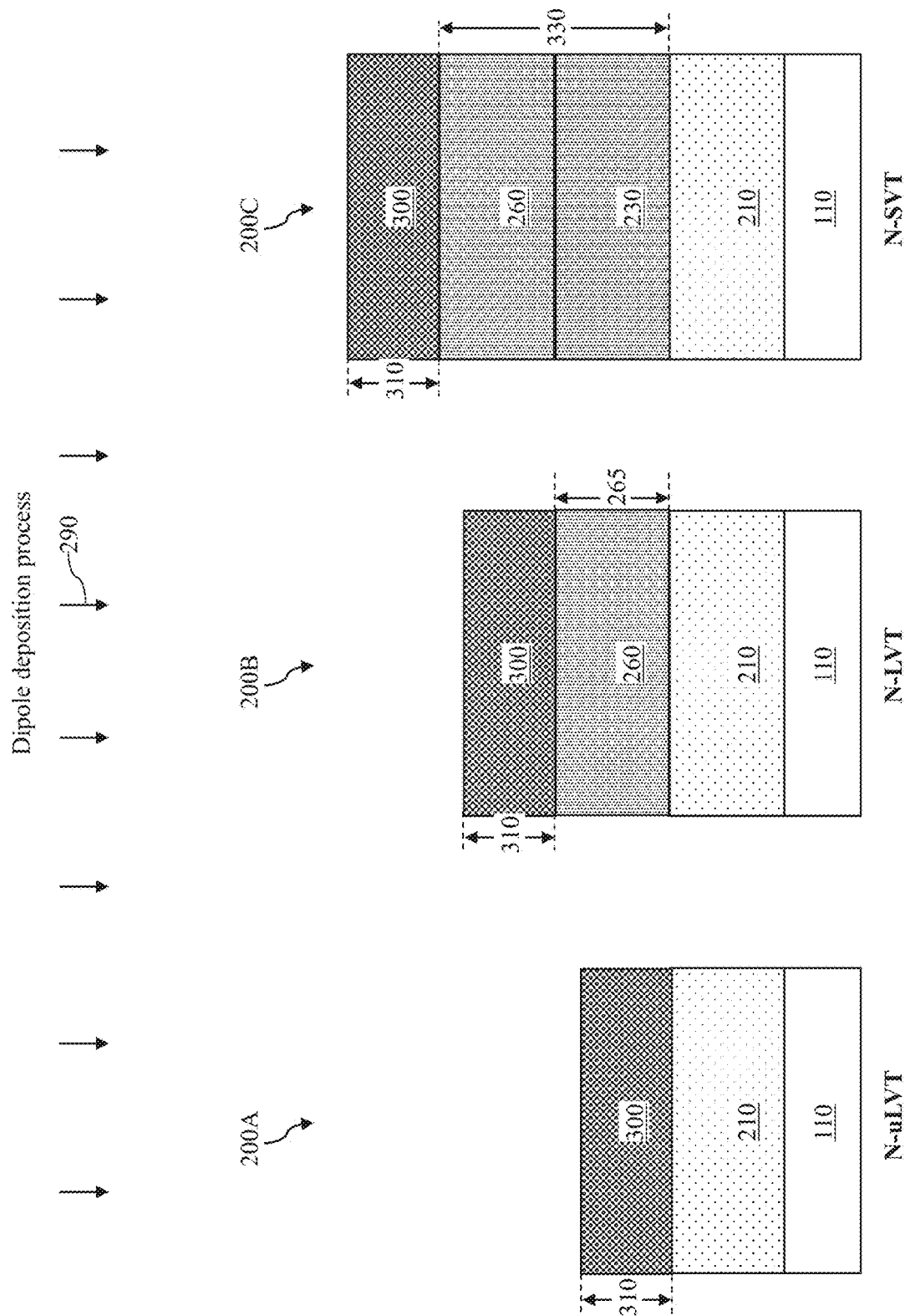

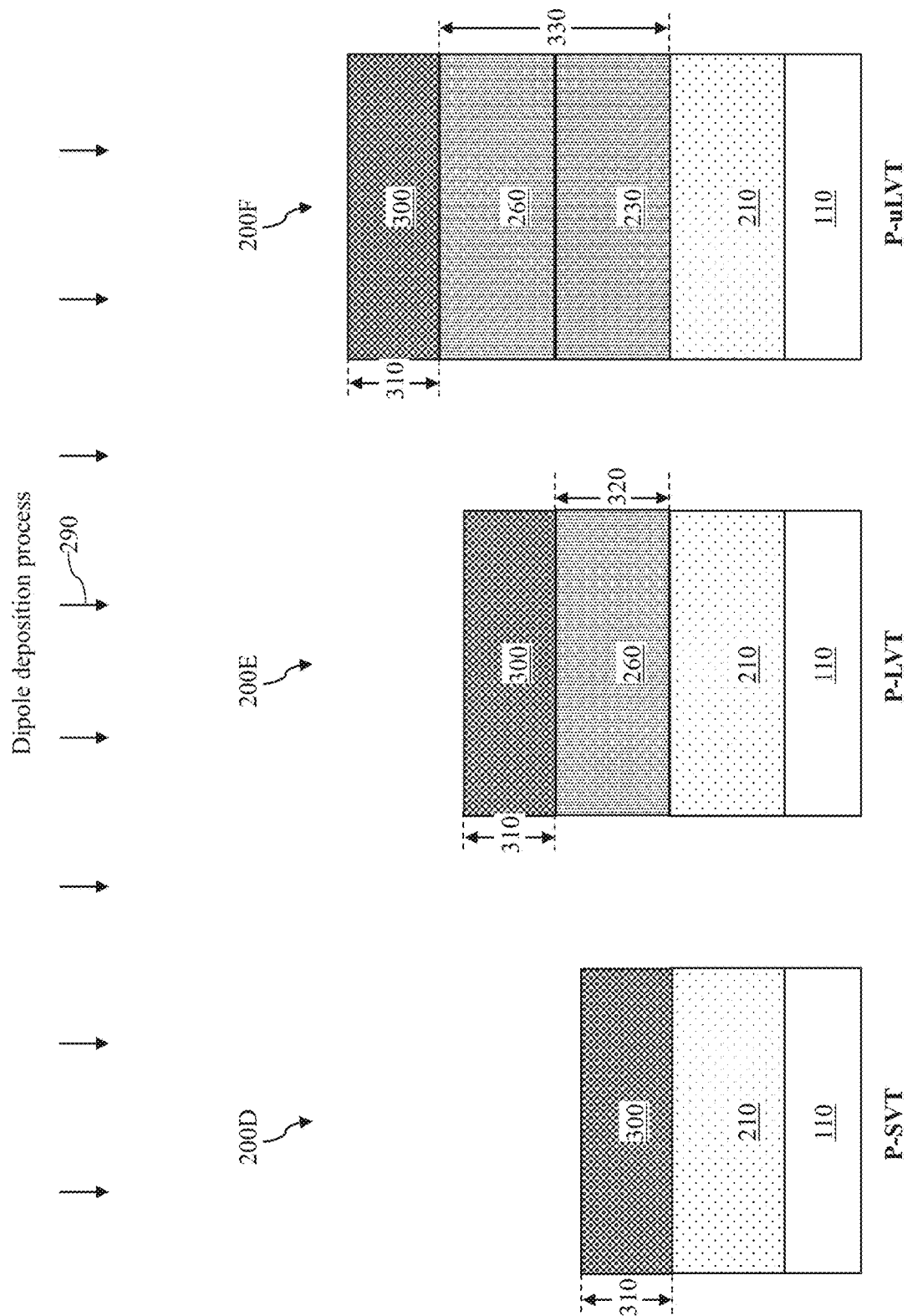

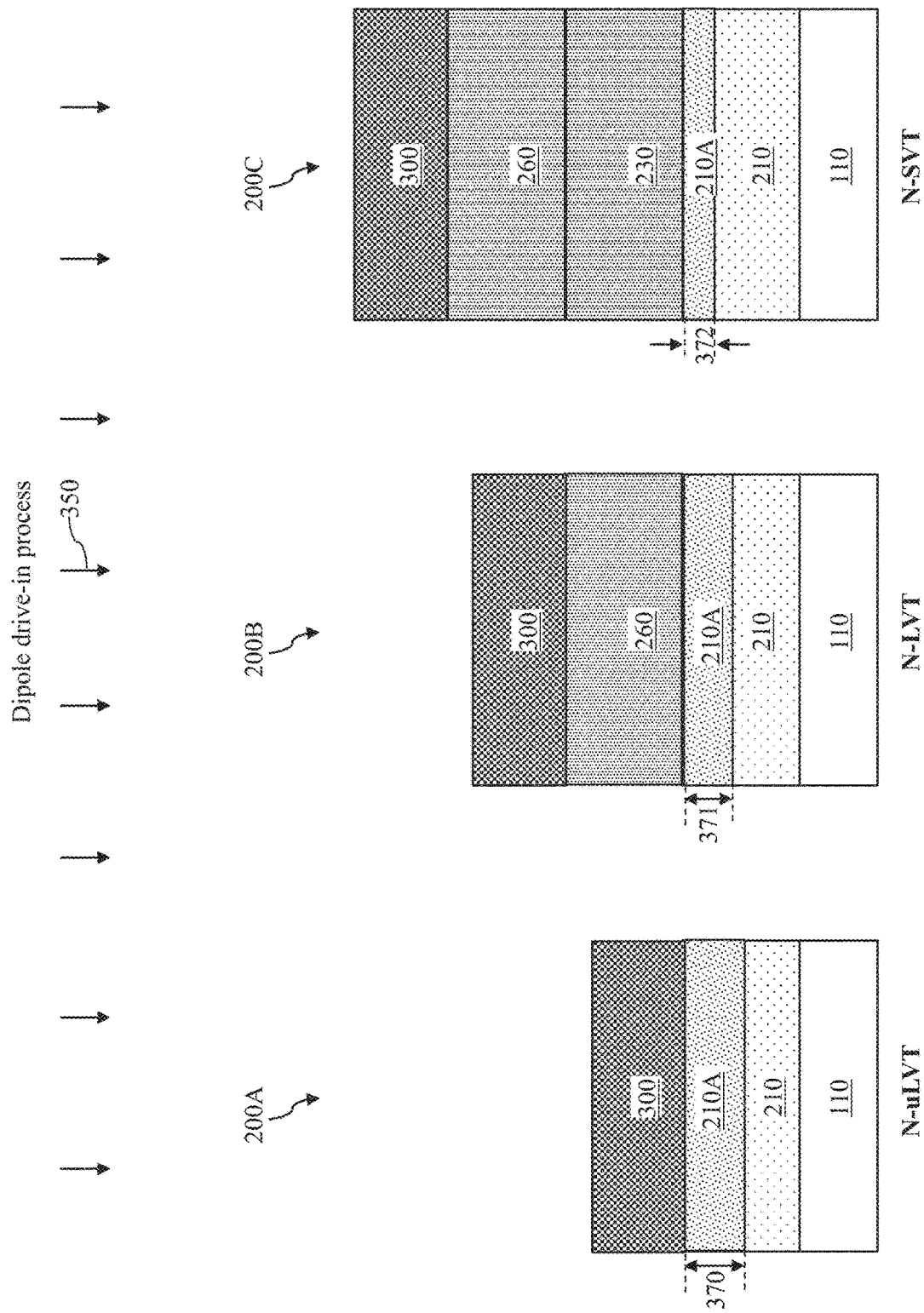

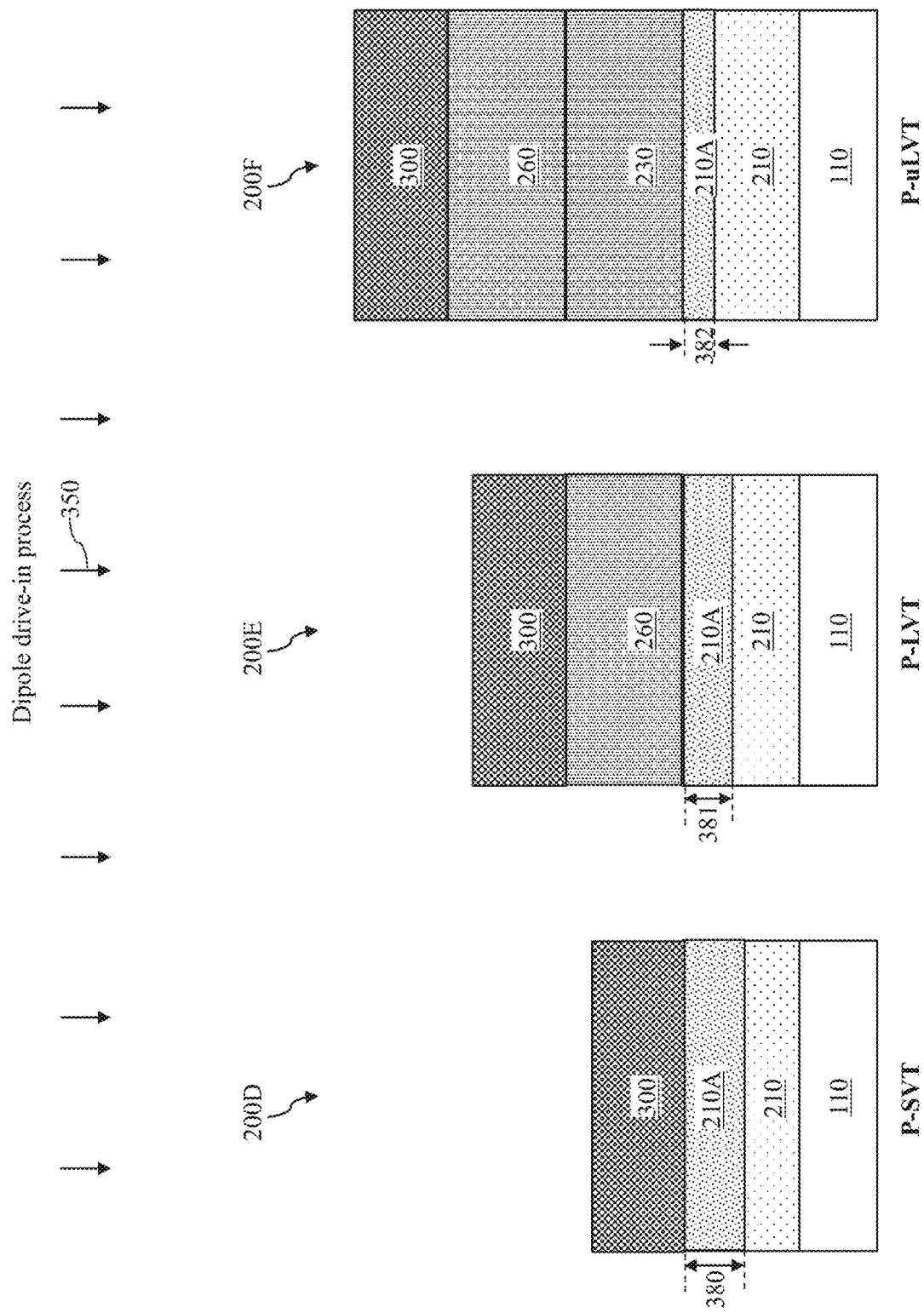

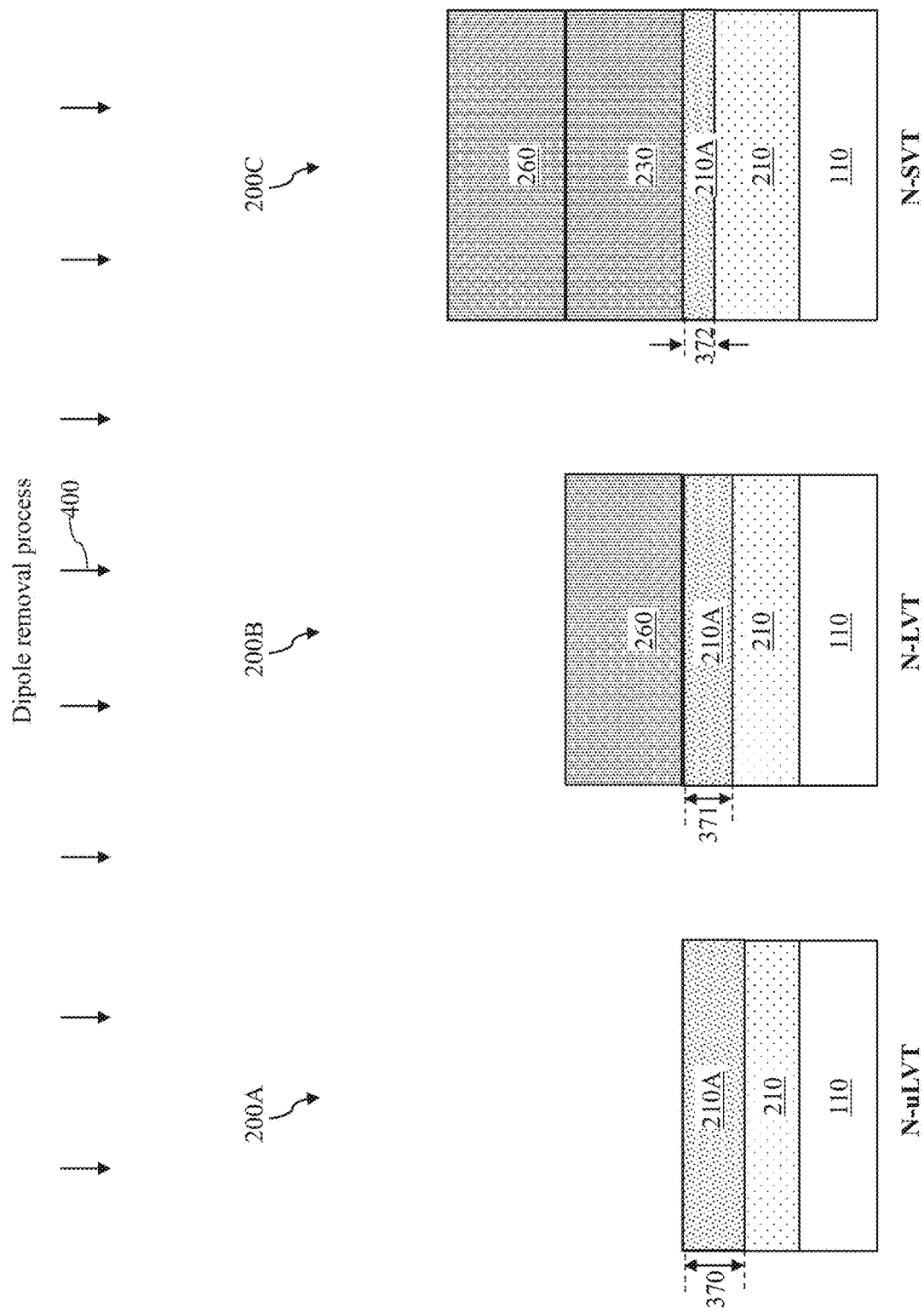

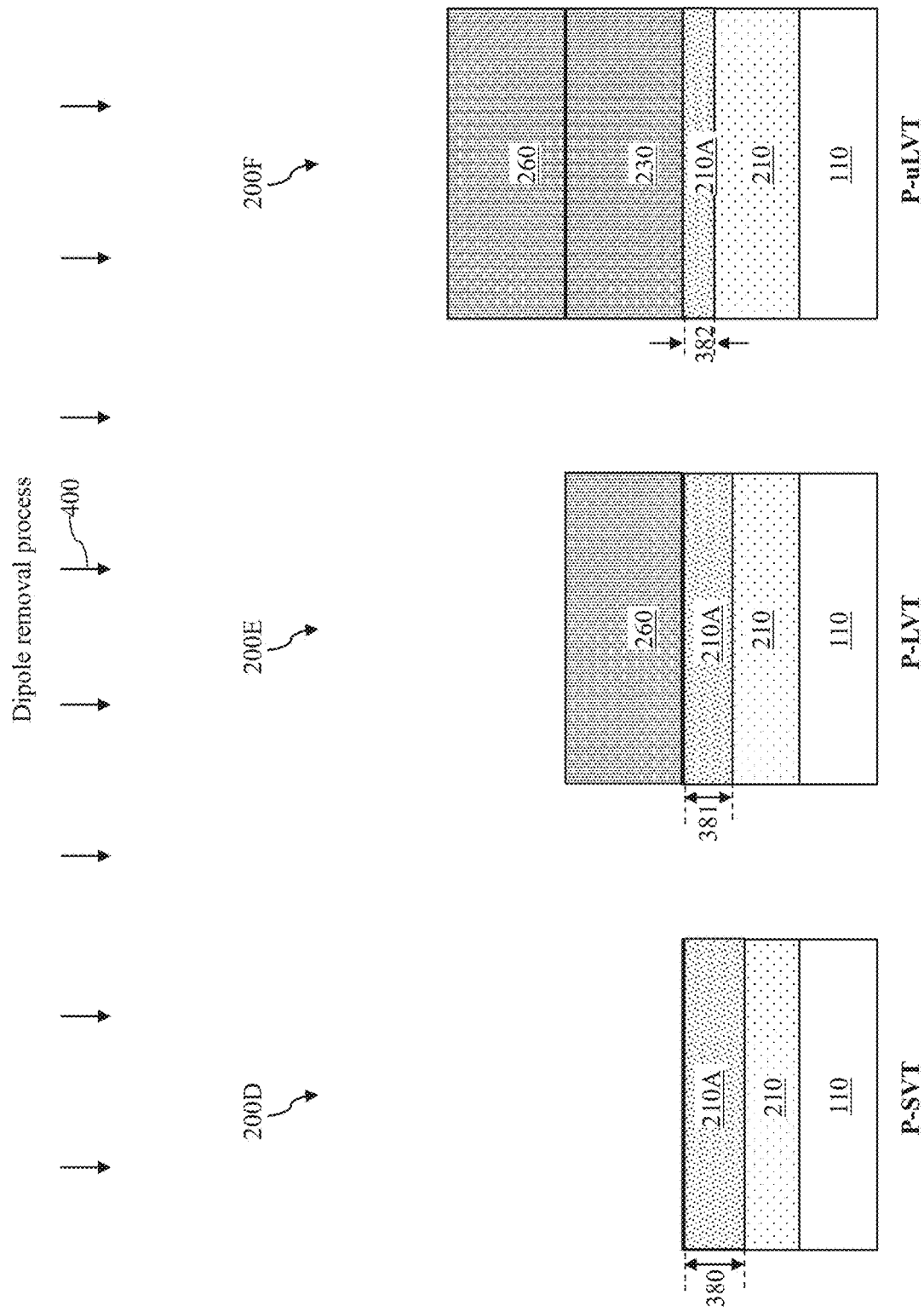

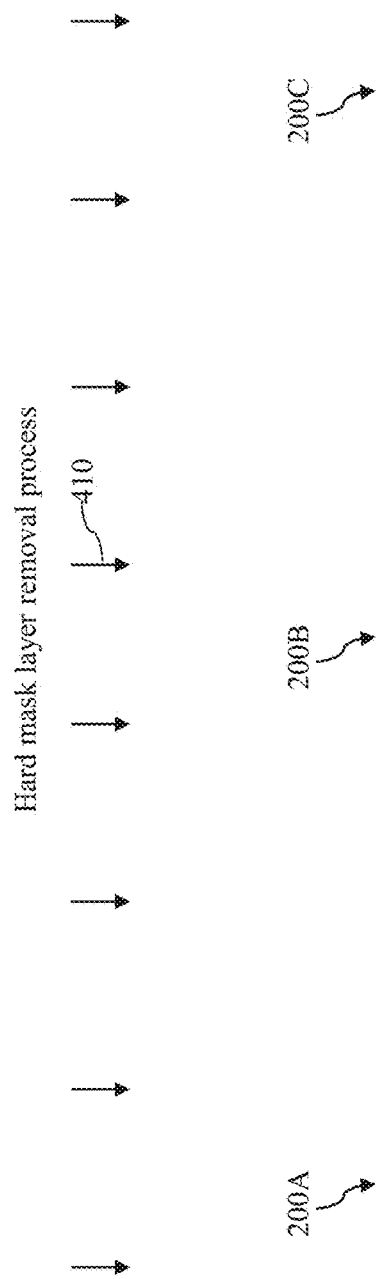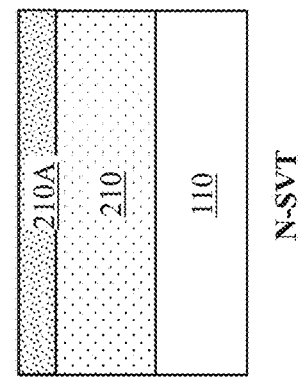
FIG. 9A  FIG. 9B  FIG. 9C

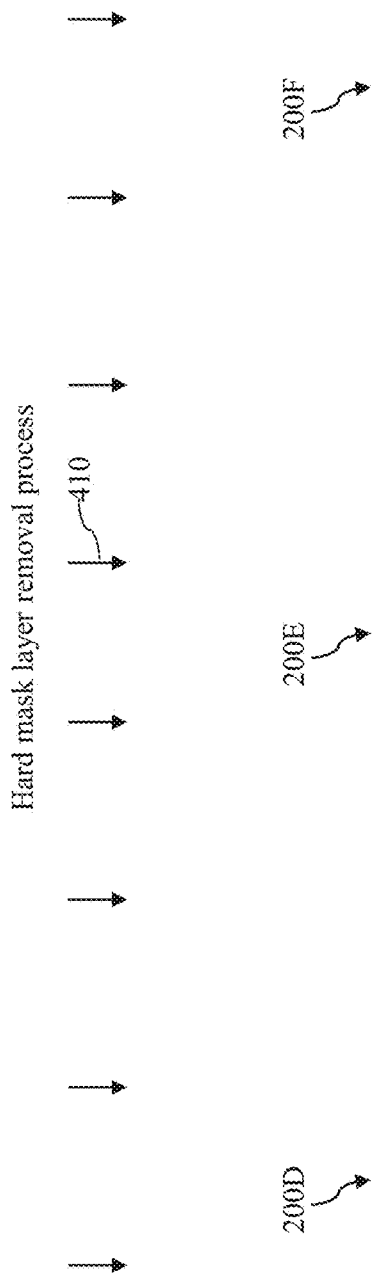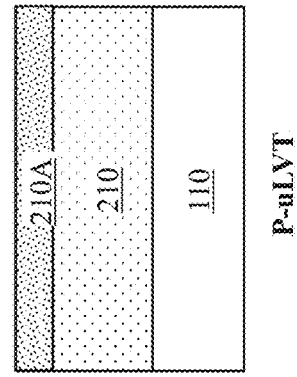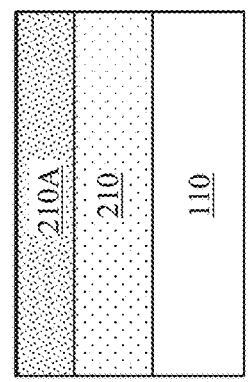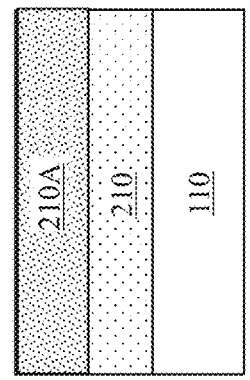

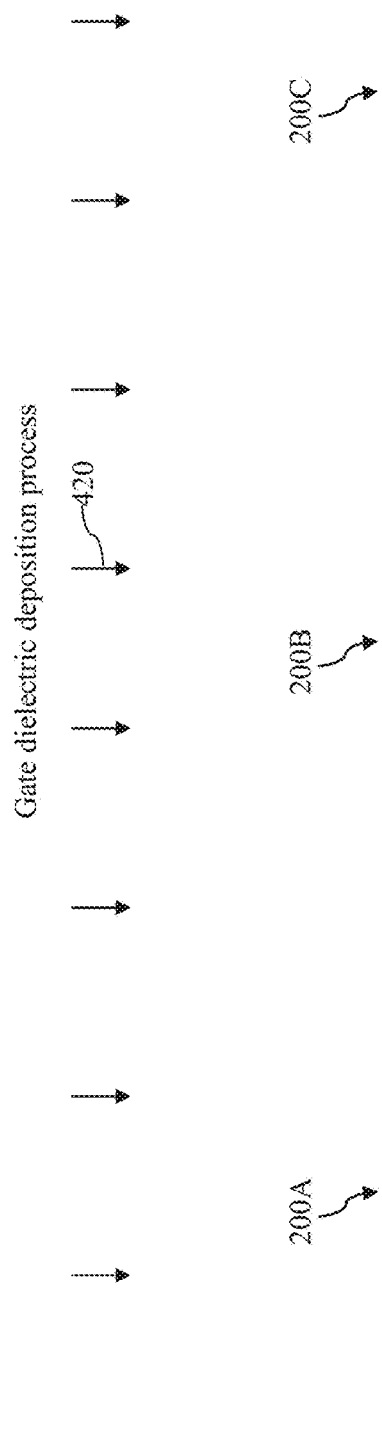
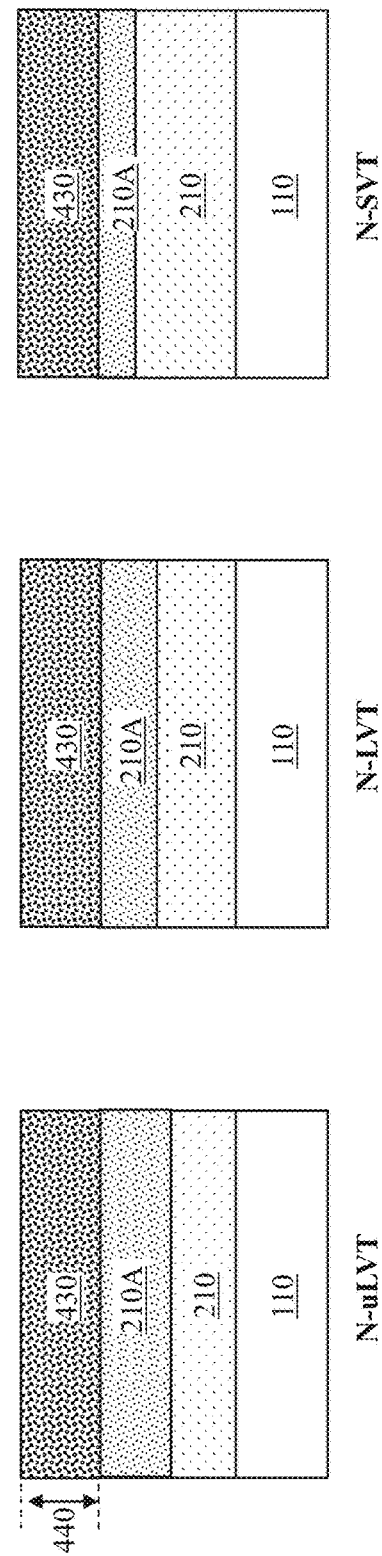
FIG. 10A  FIG. 10B  FIG. 10C

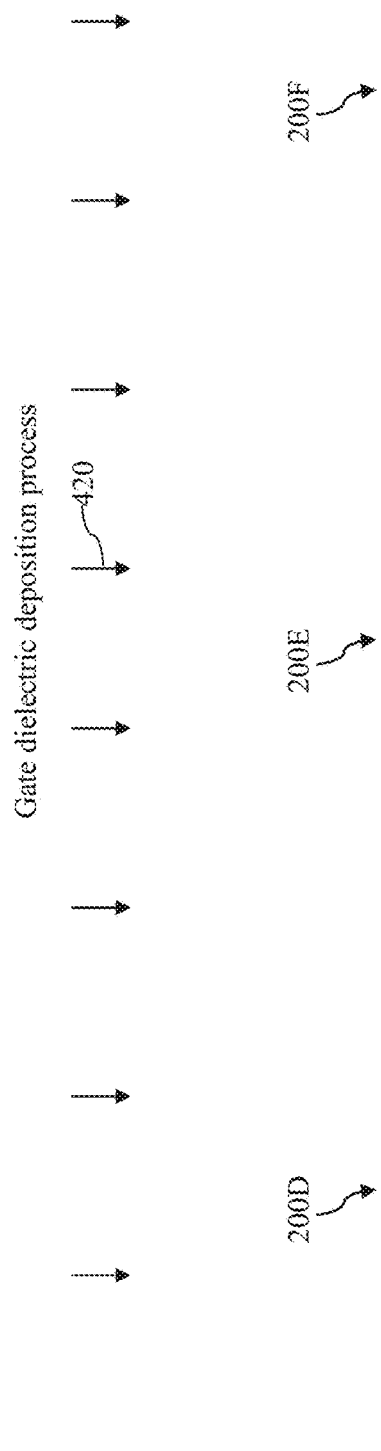
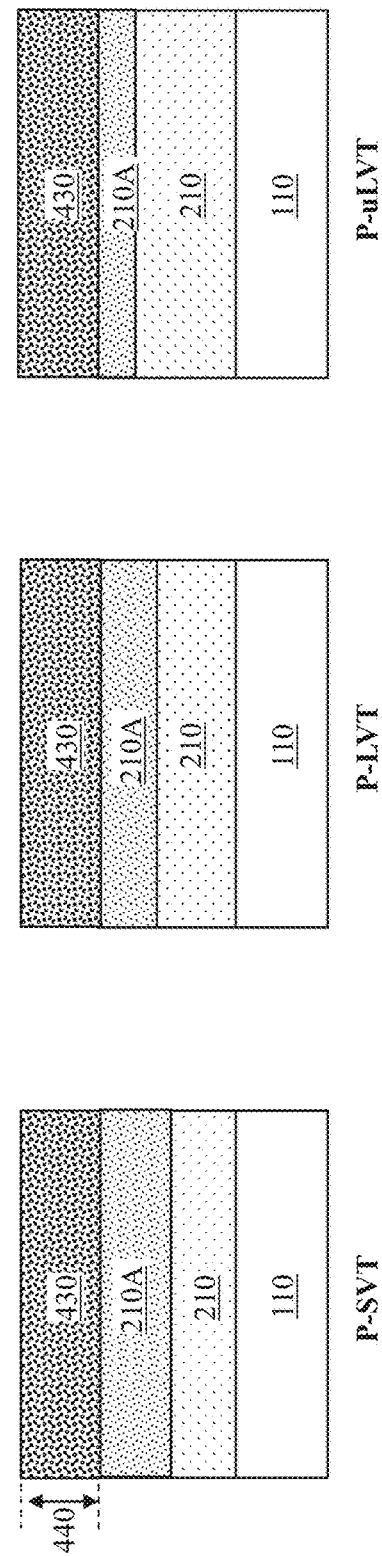

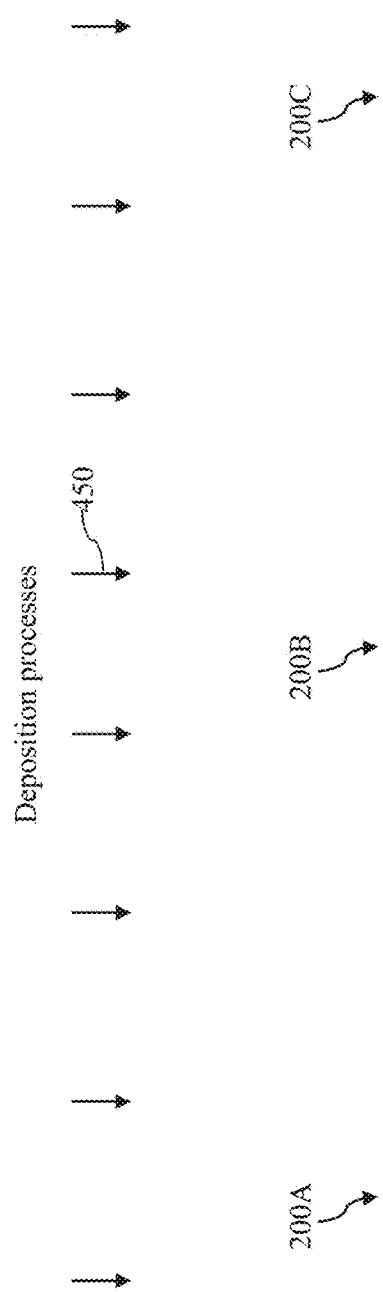
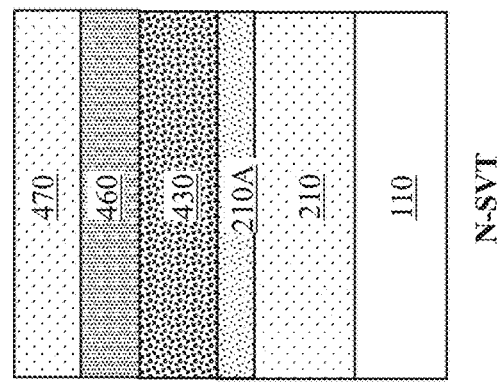
N-SVT
FIG. 11C
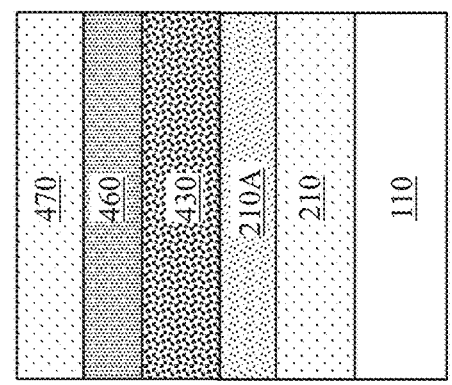
N-LVT
FIG. 11B
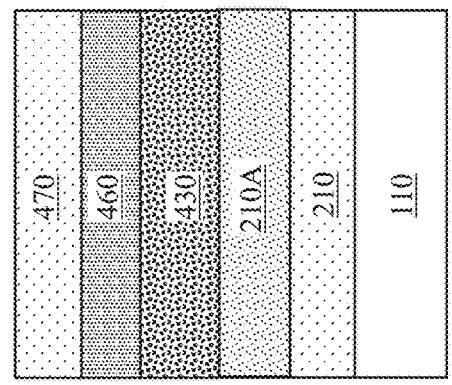
N-uLVT
FIG. 11A

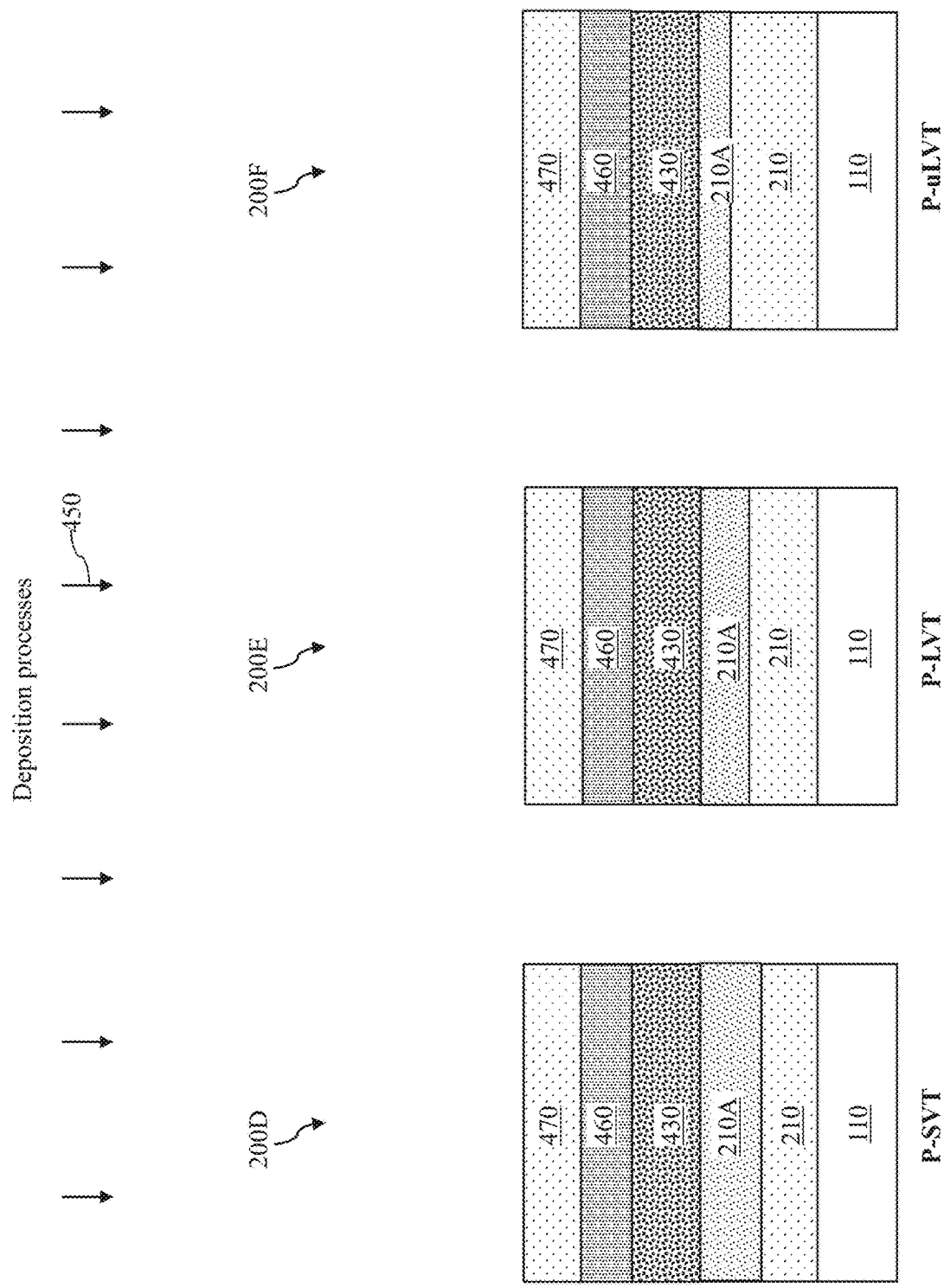

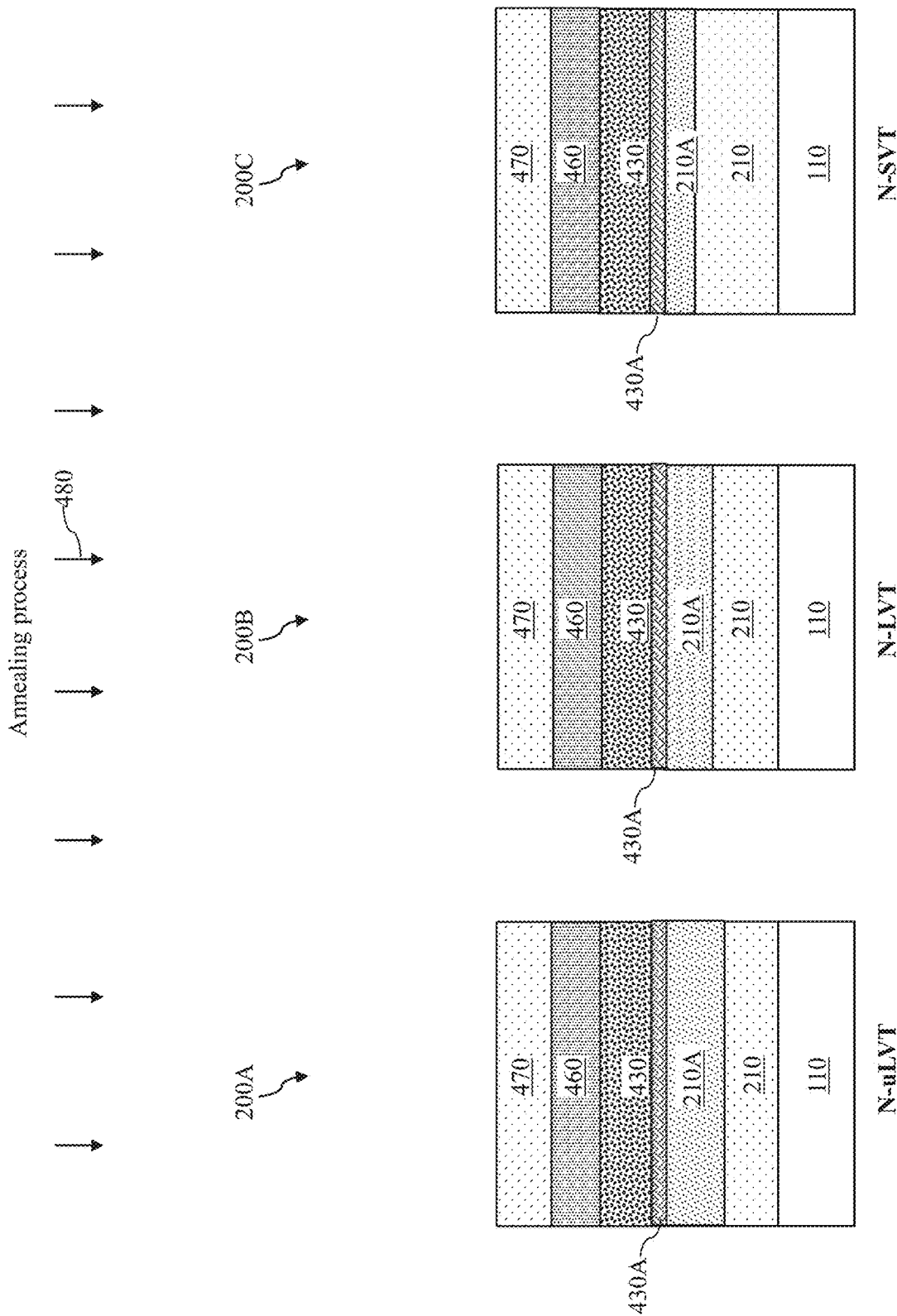

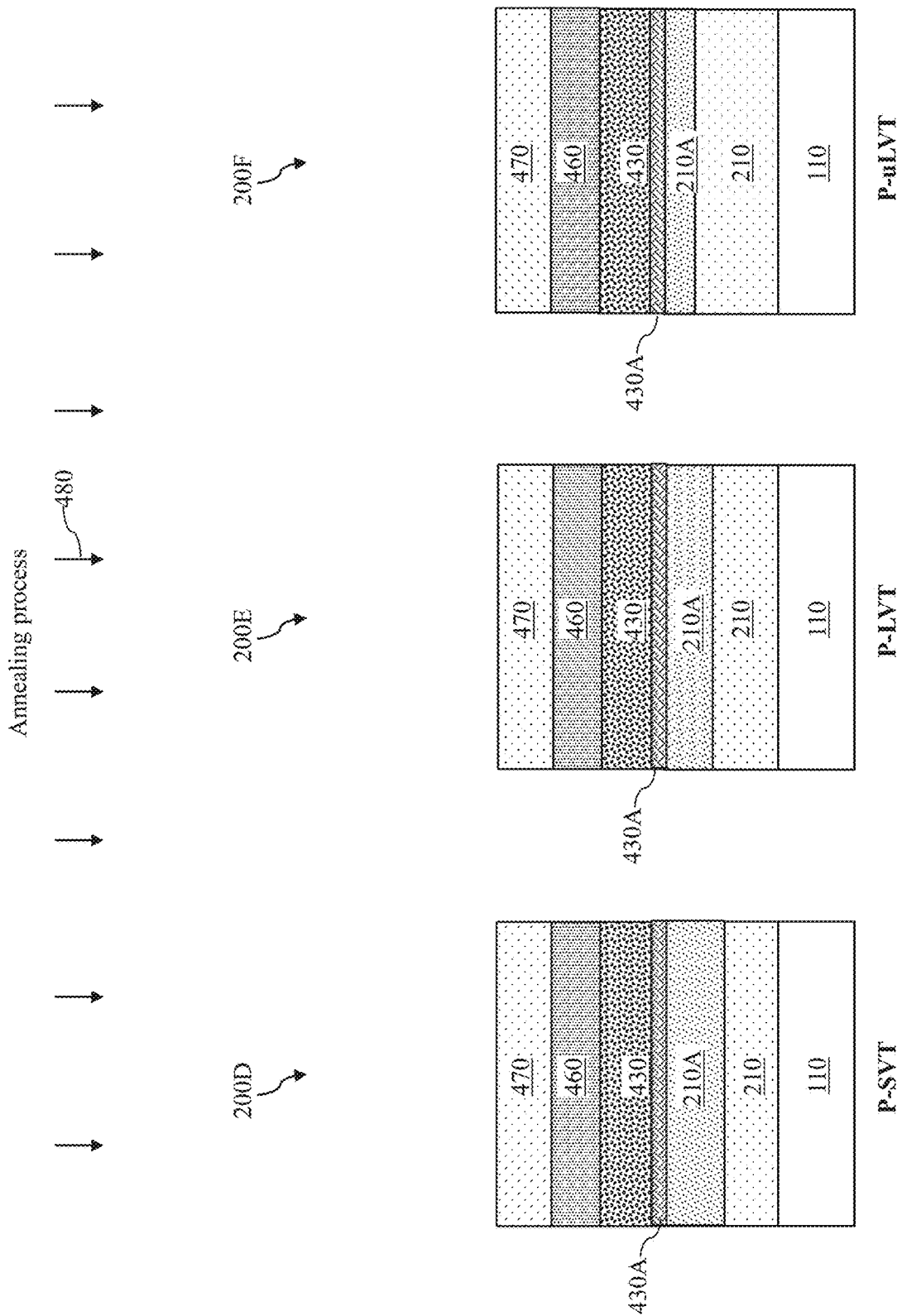

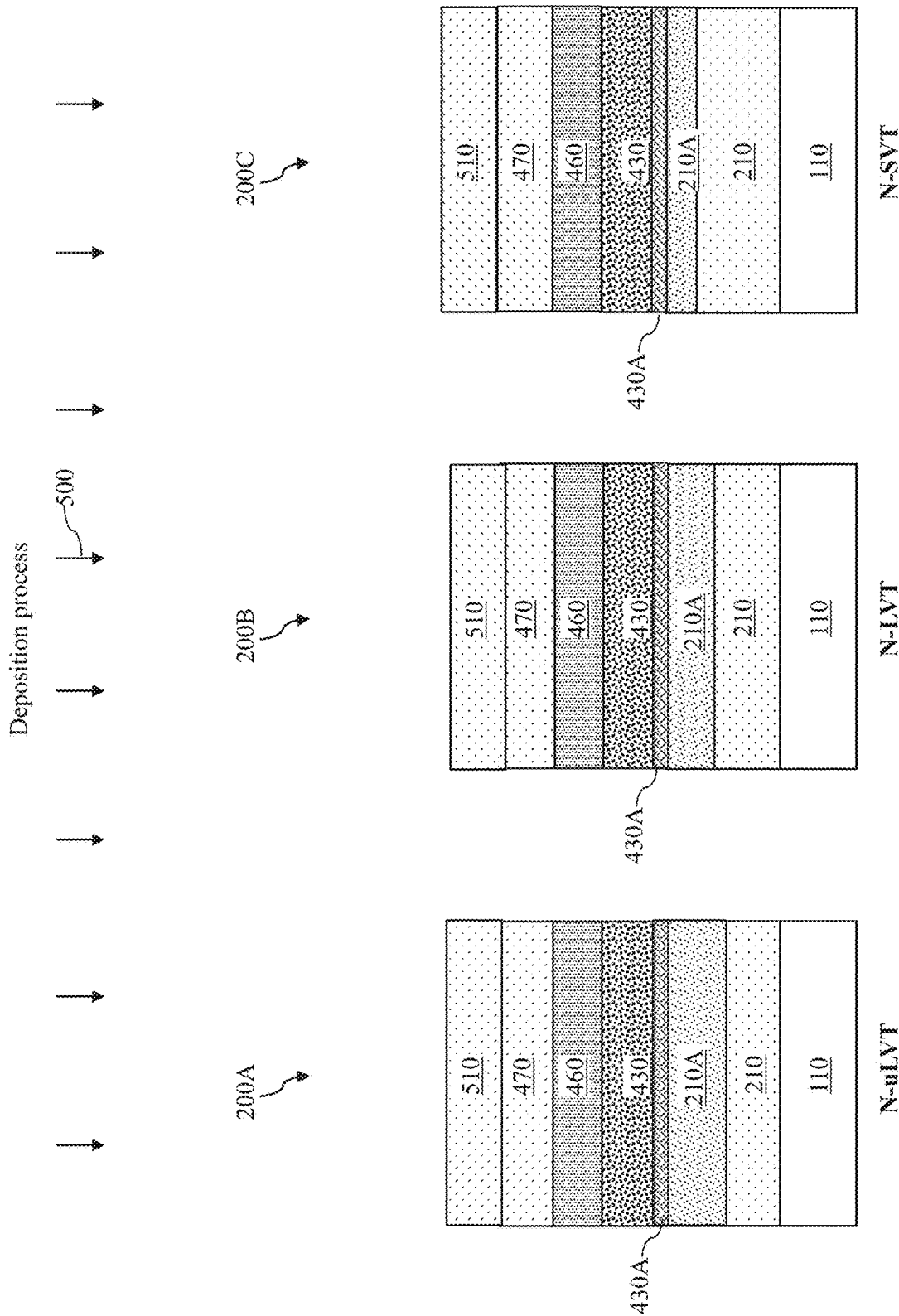

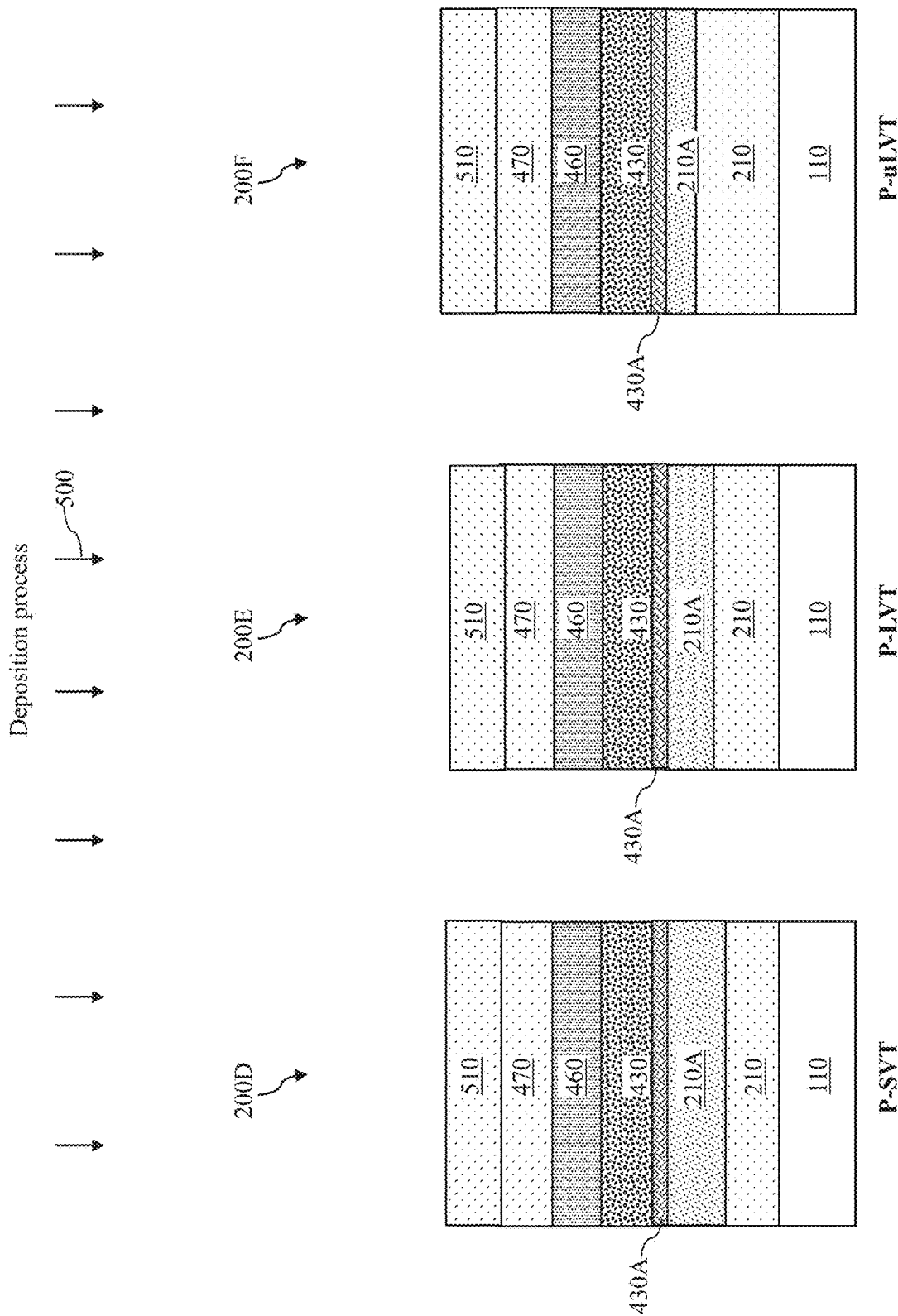

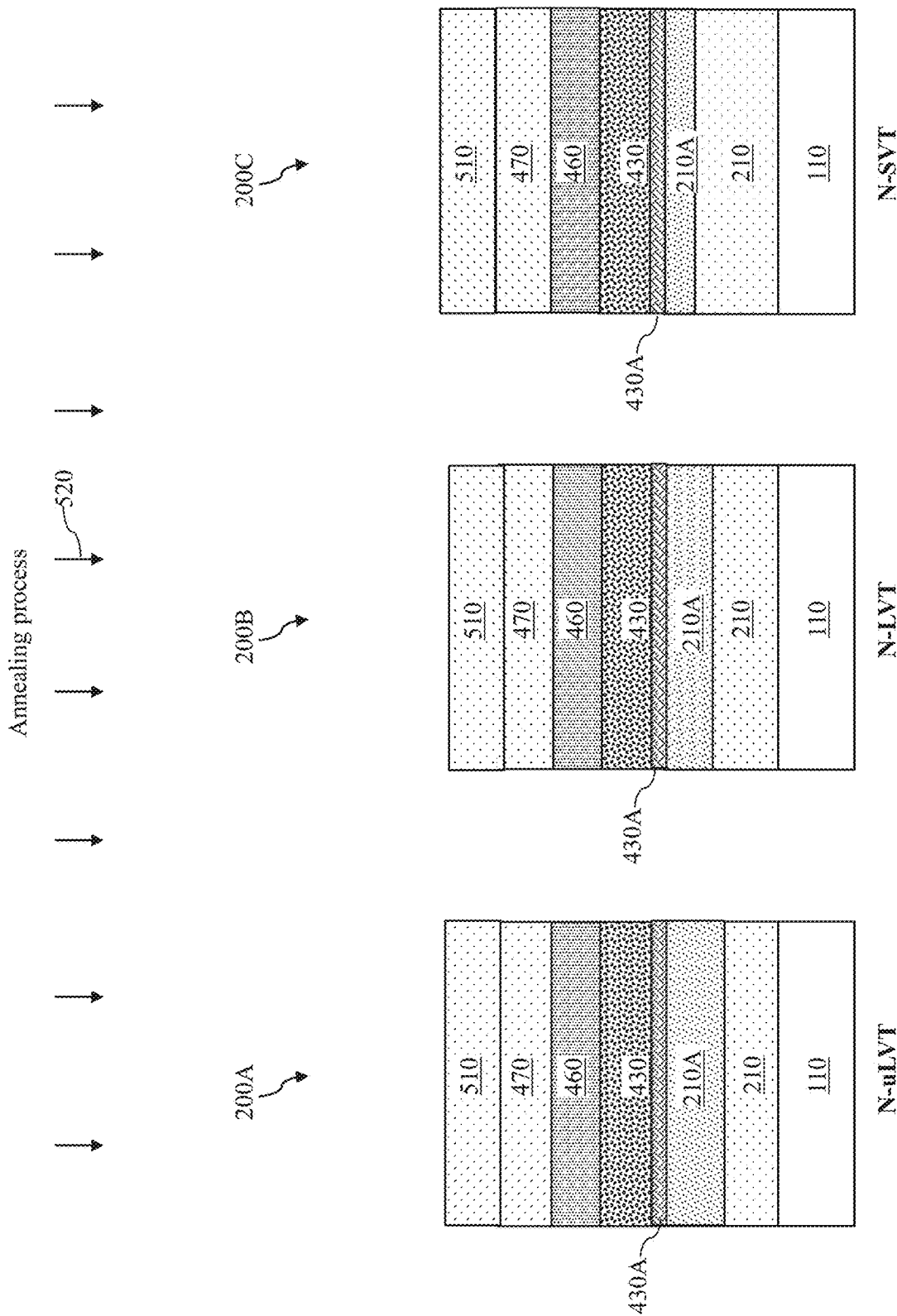

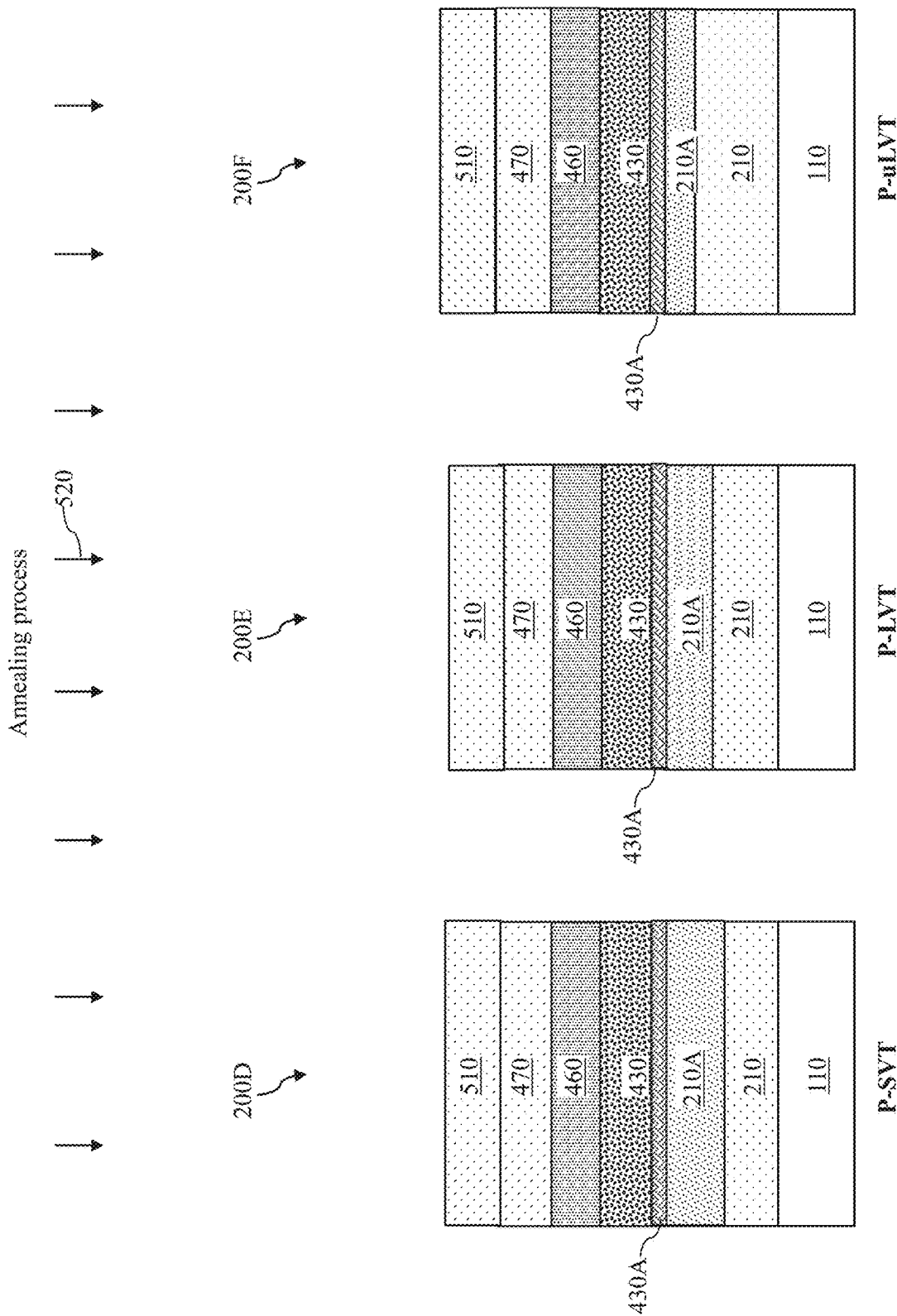

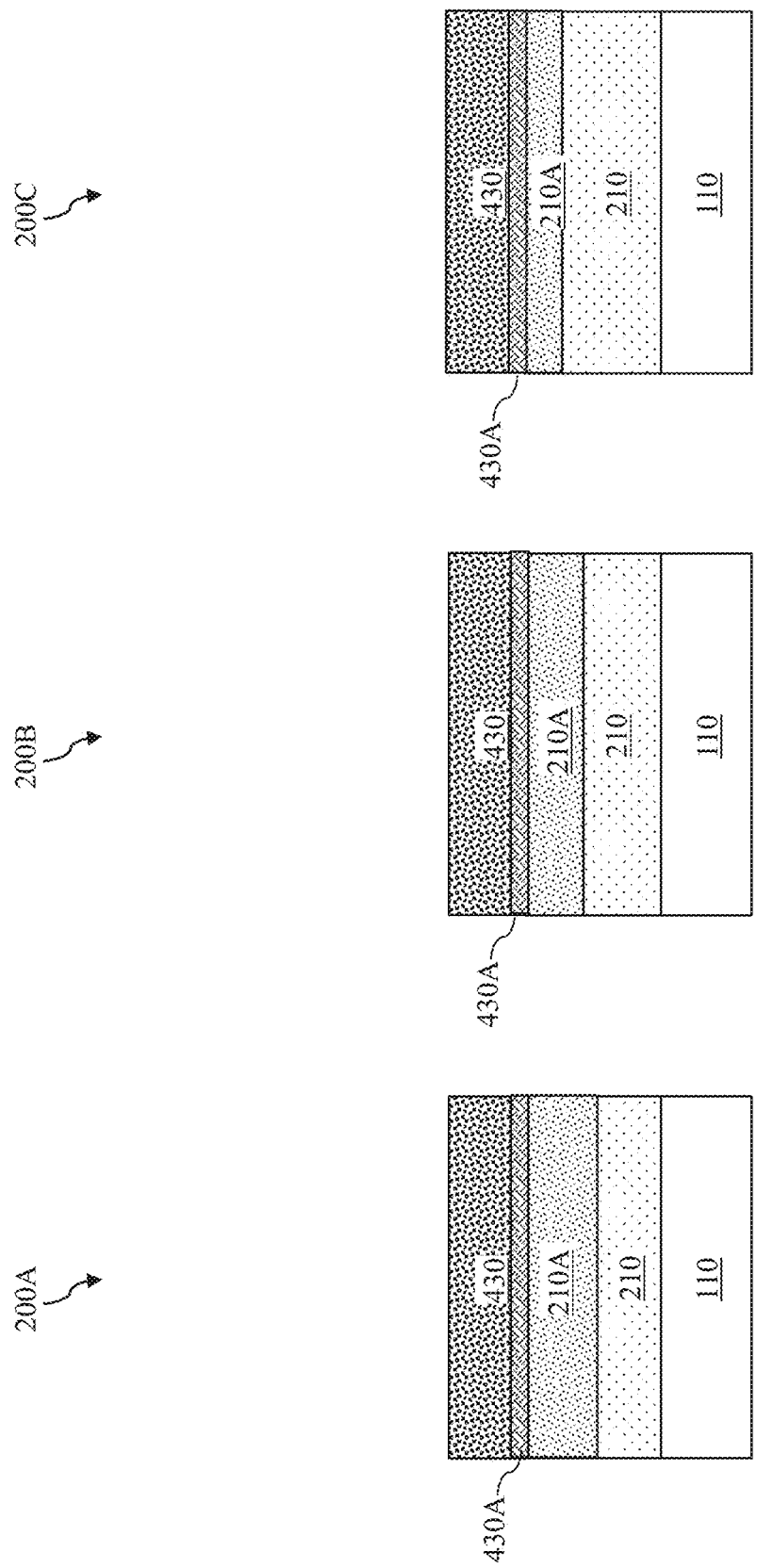

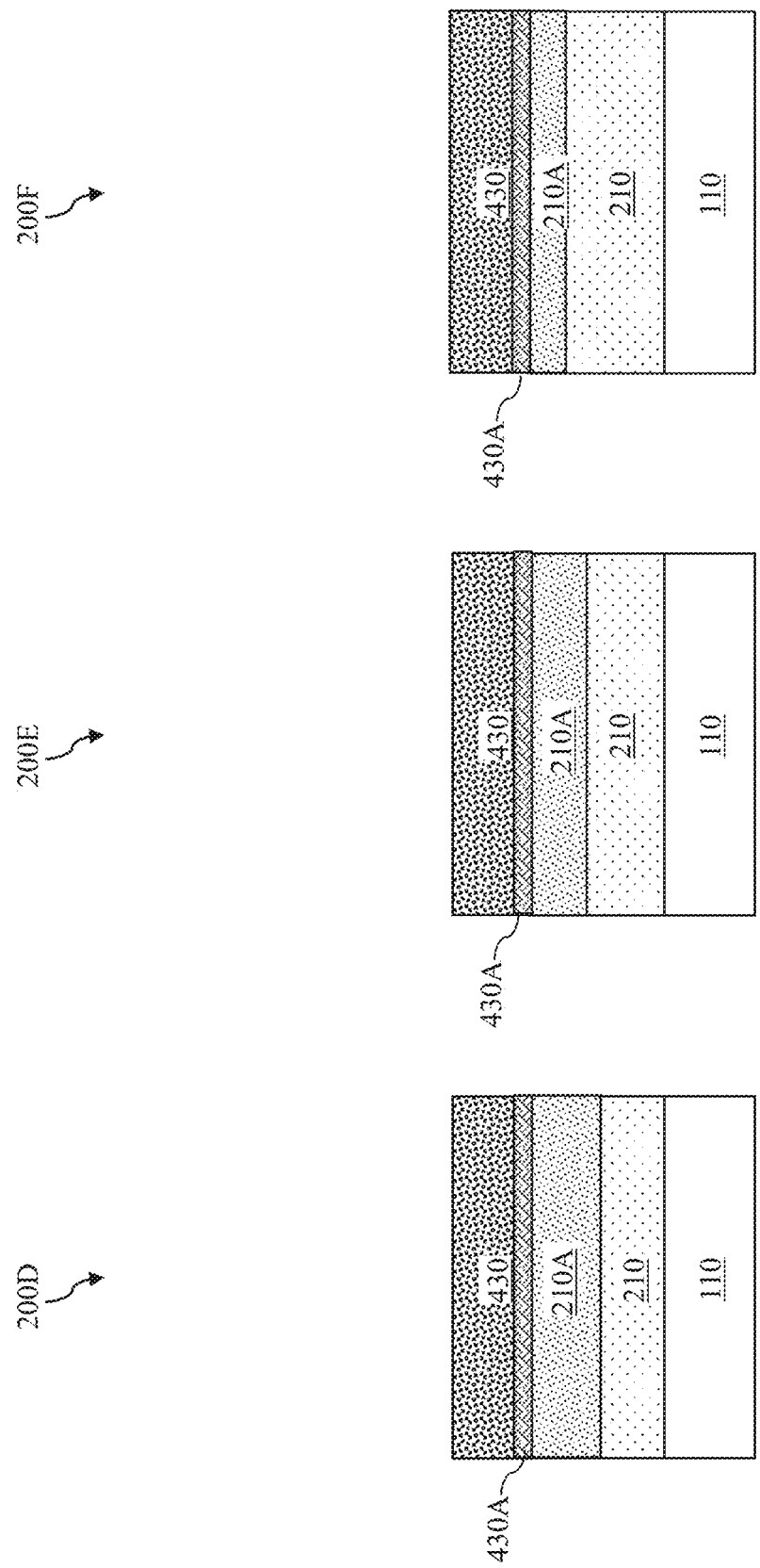

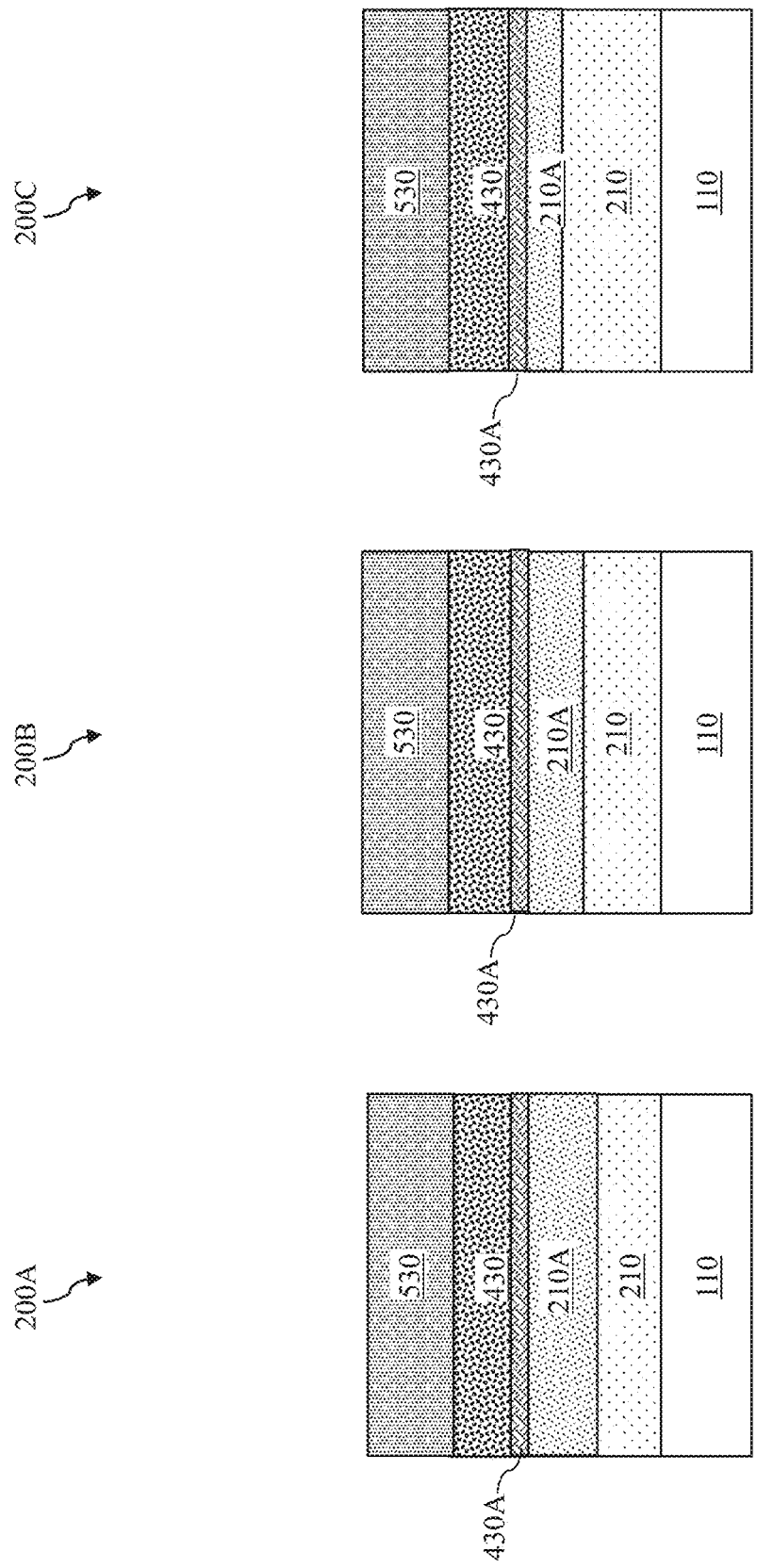

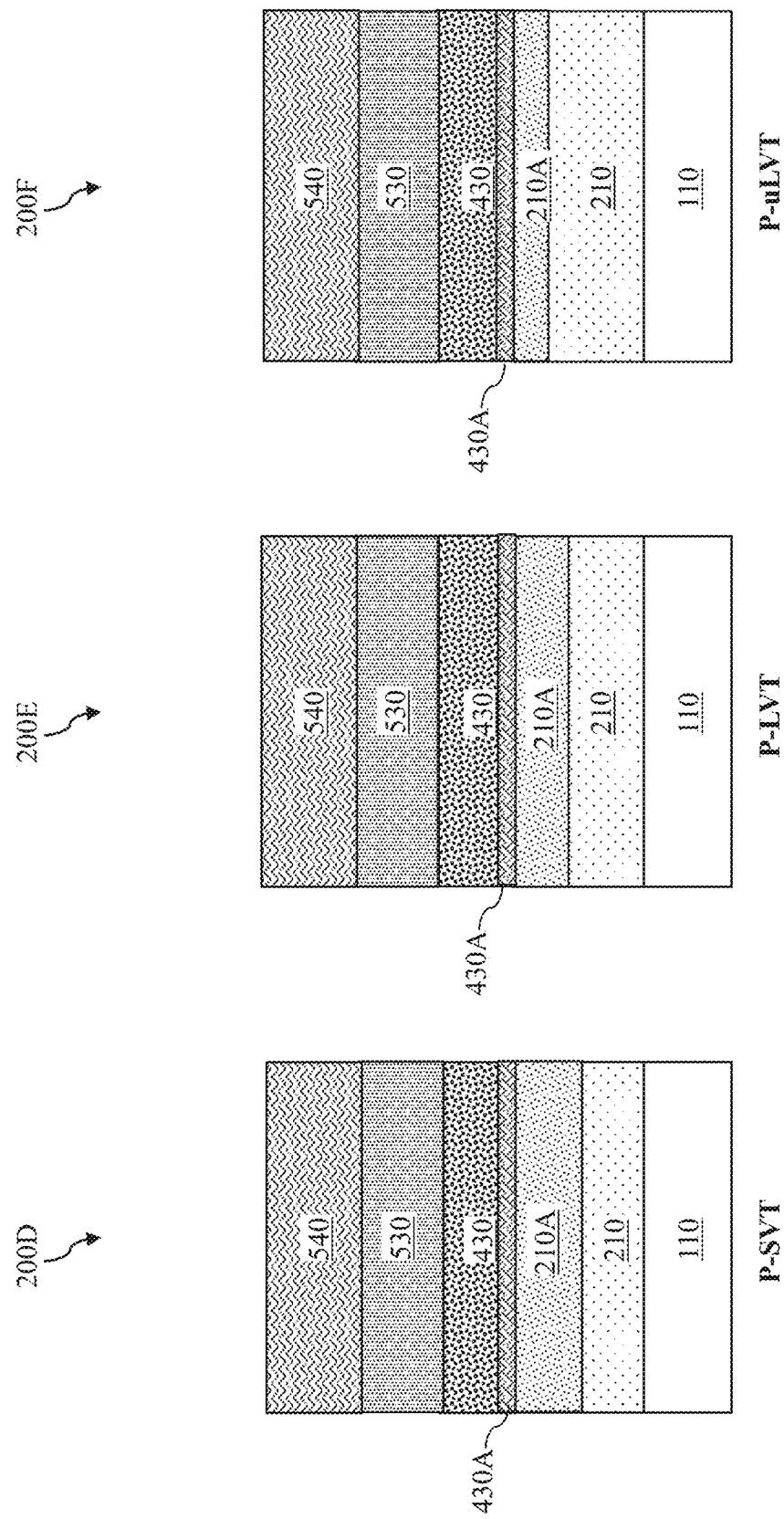

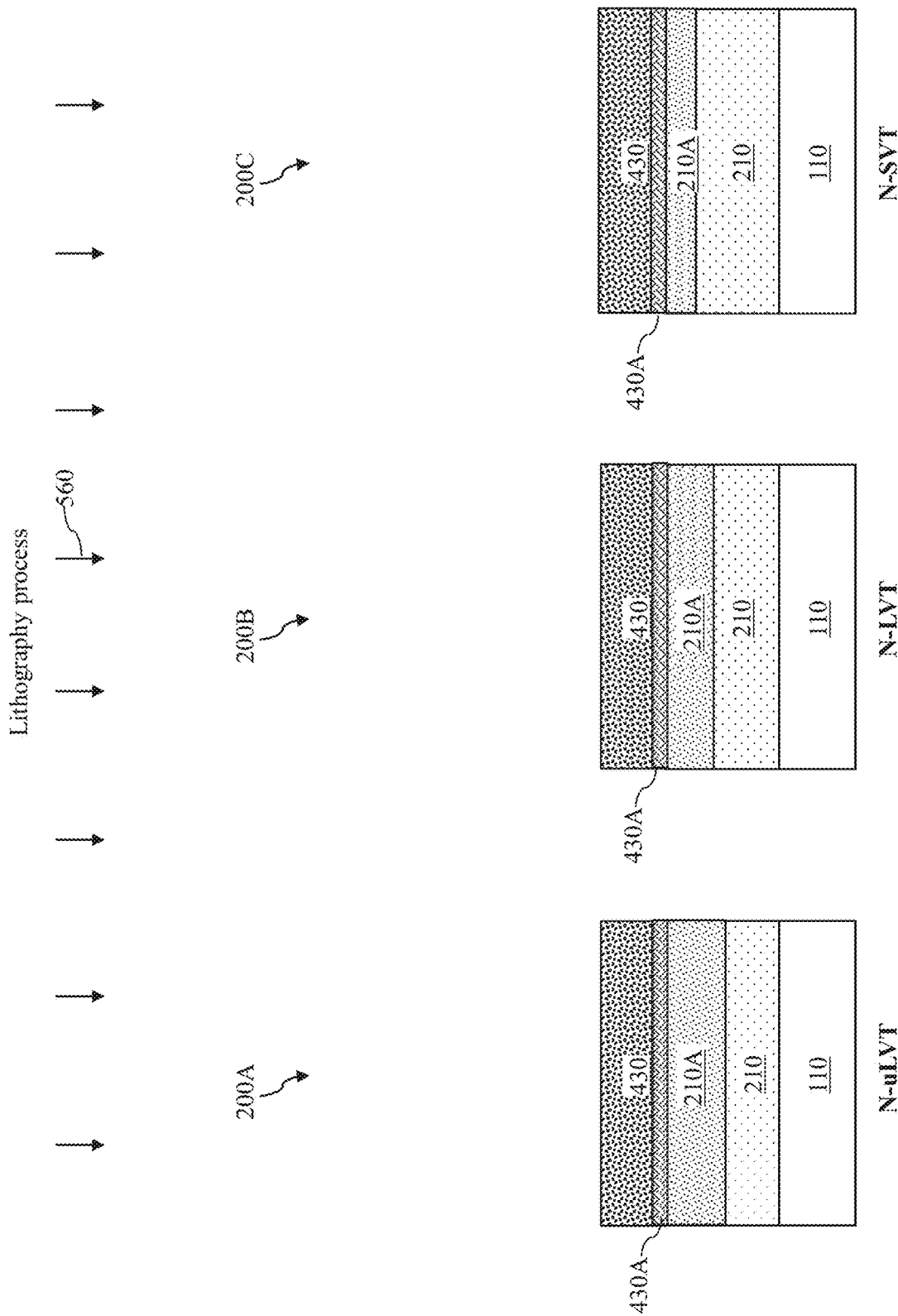

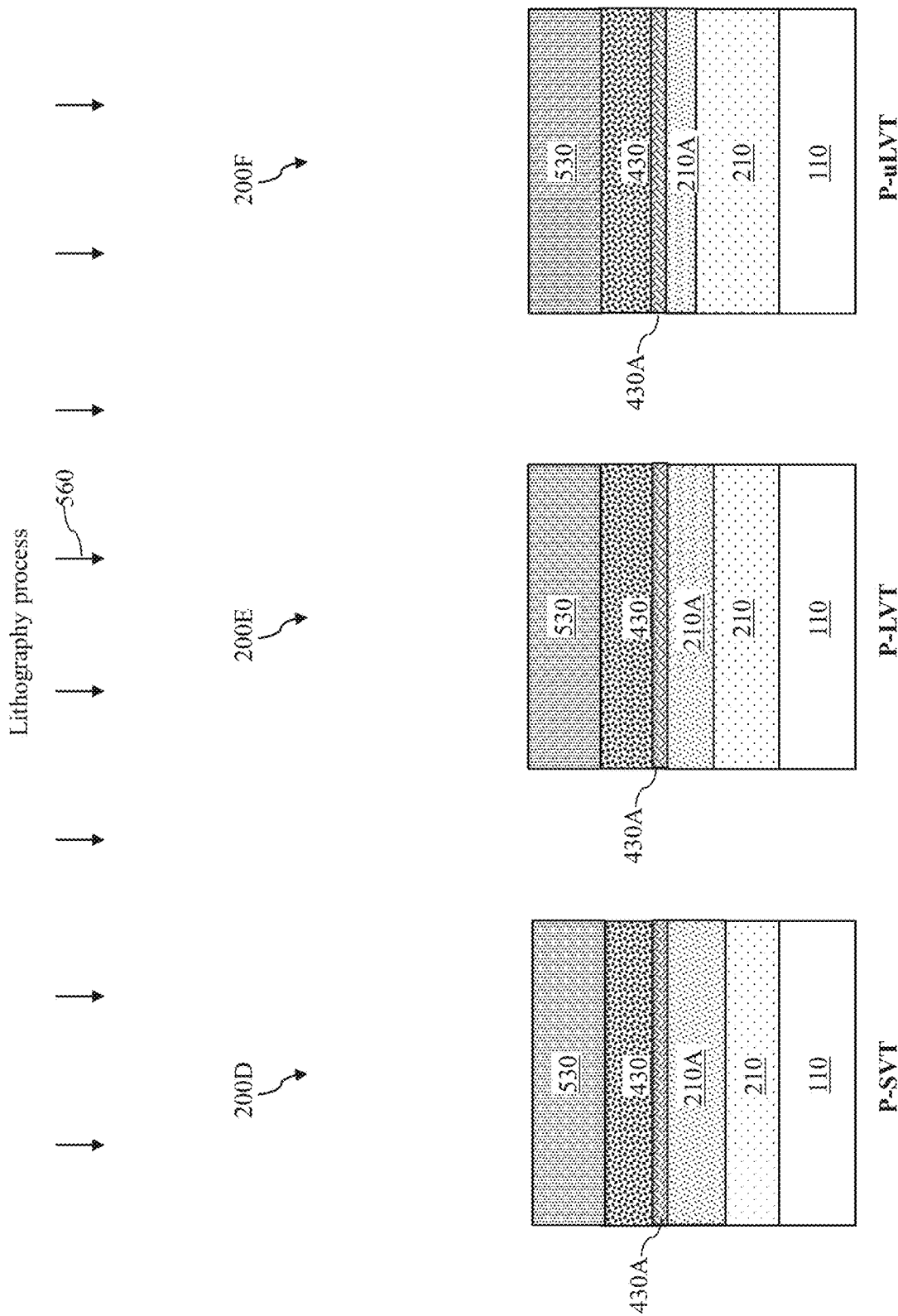

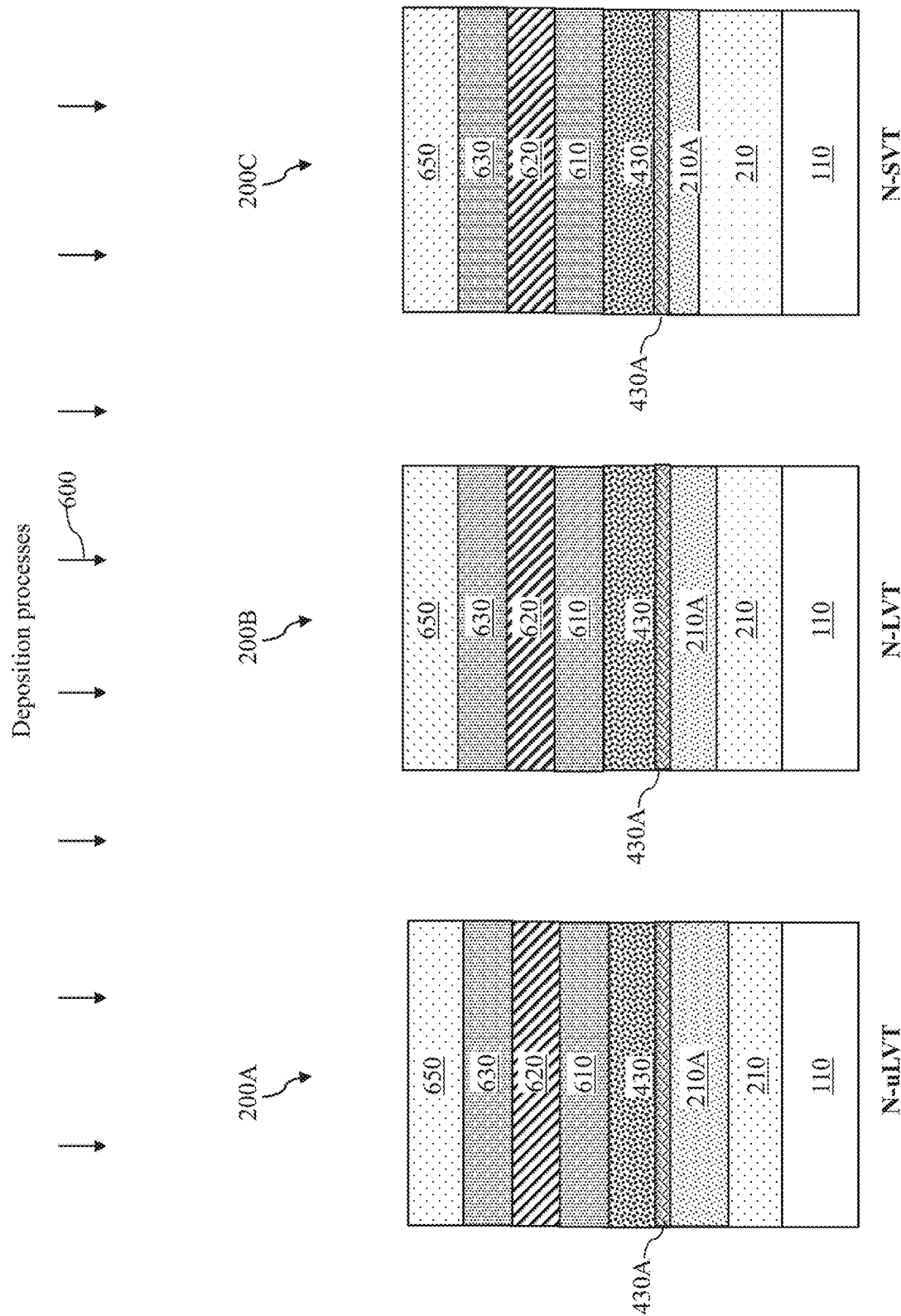

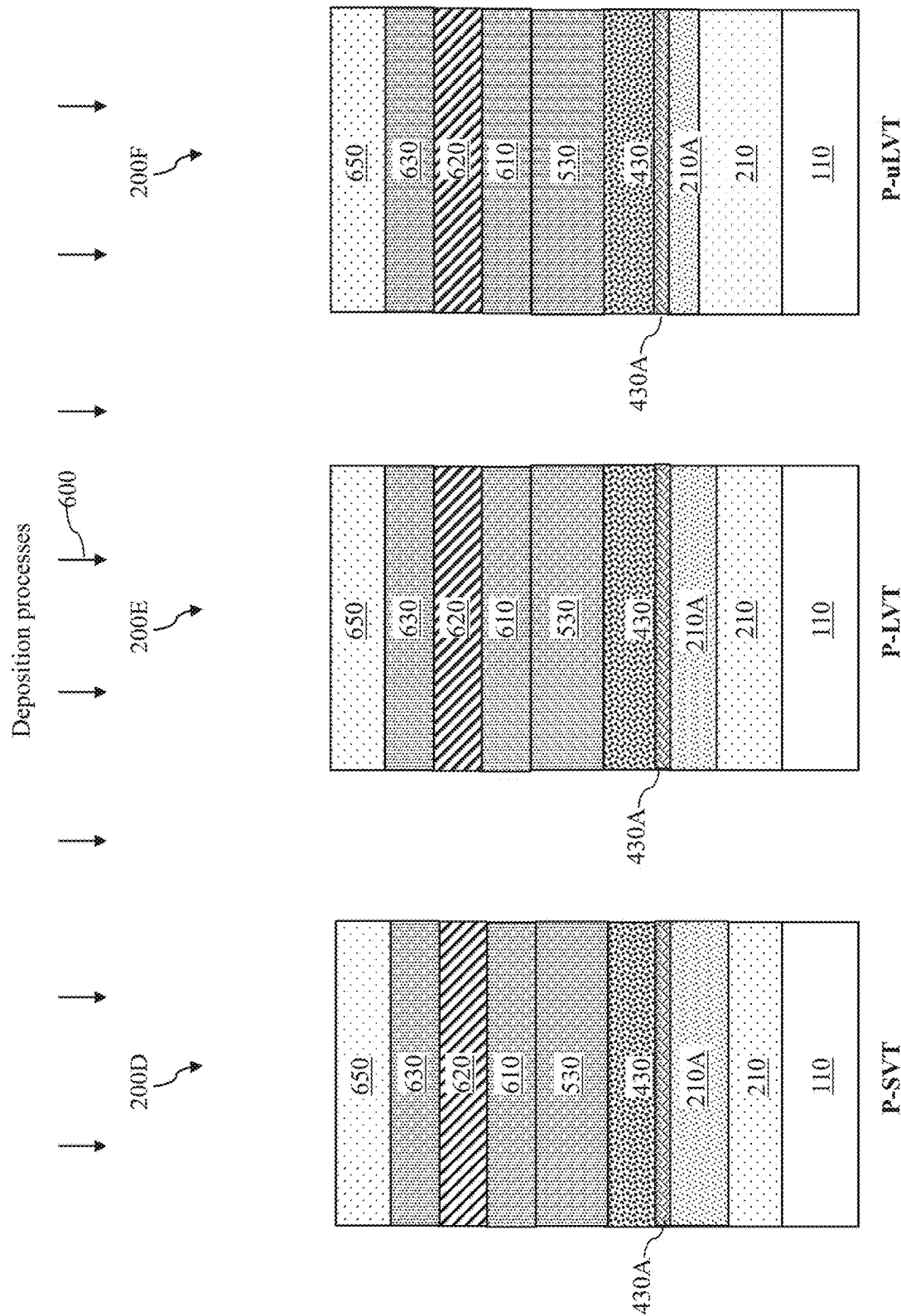

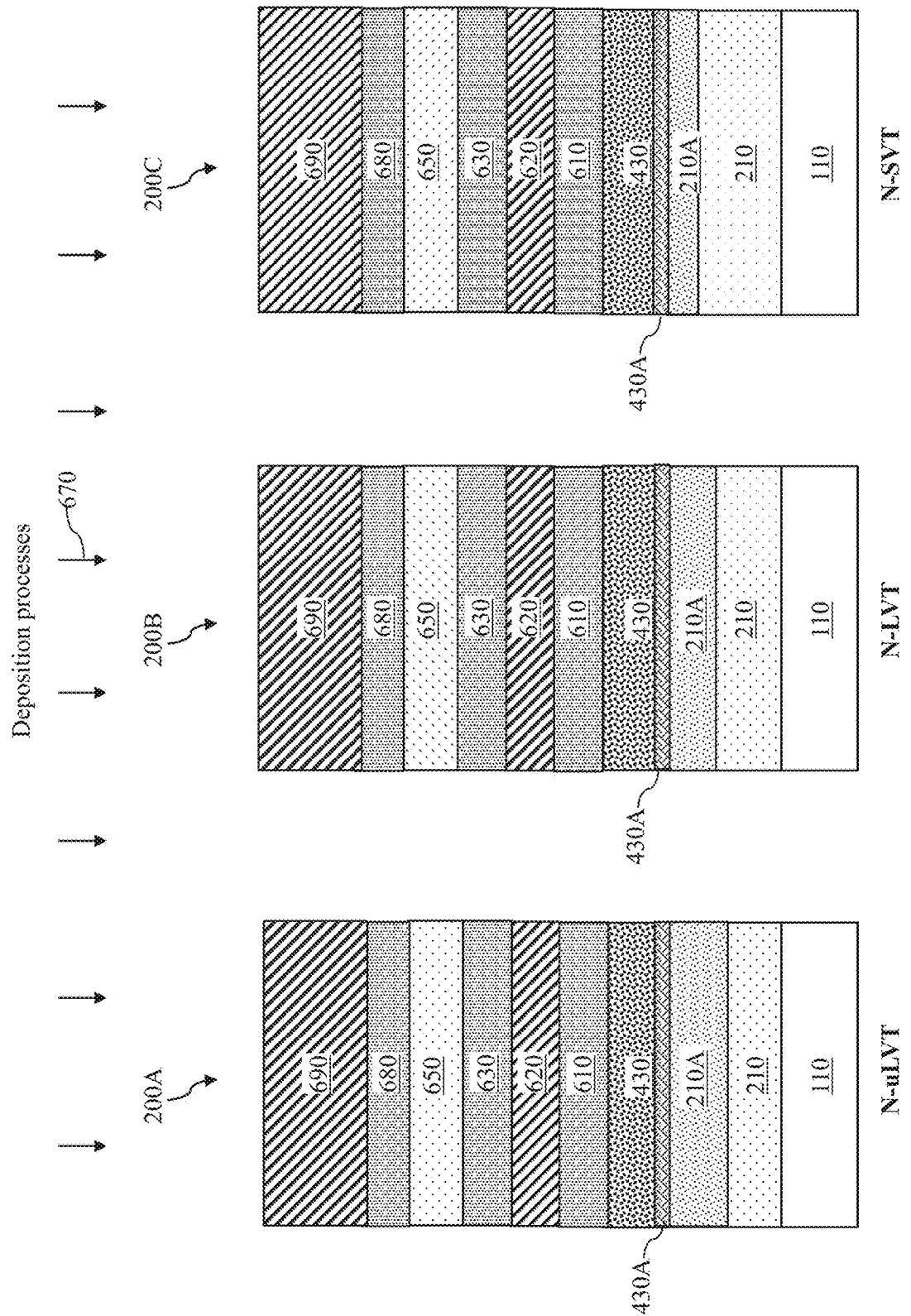

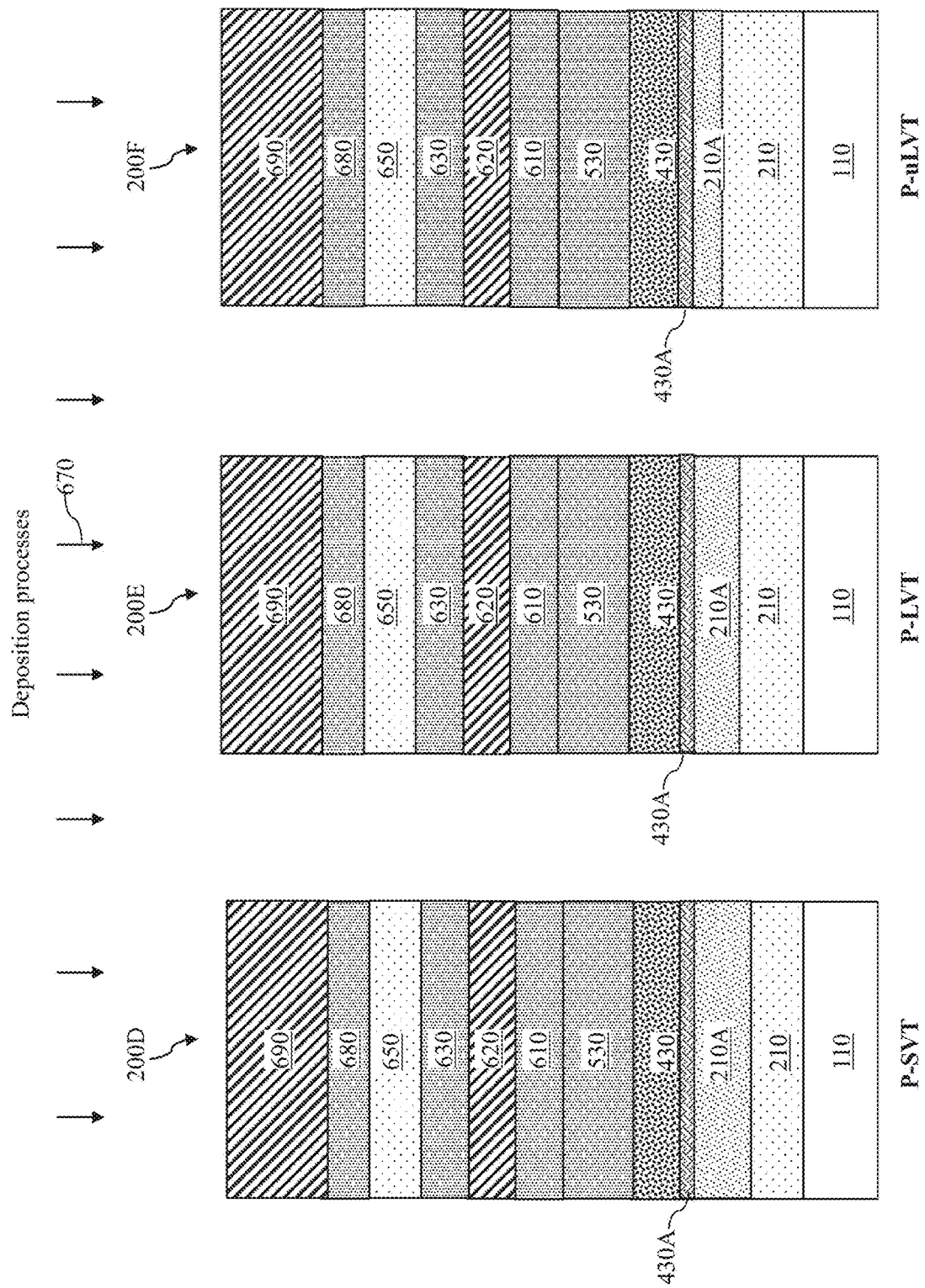

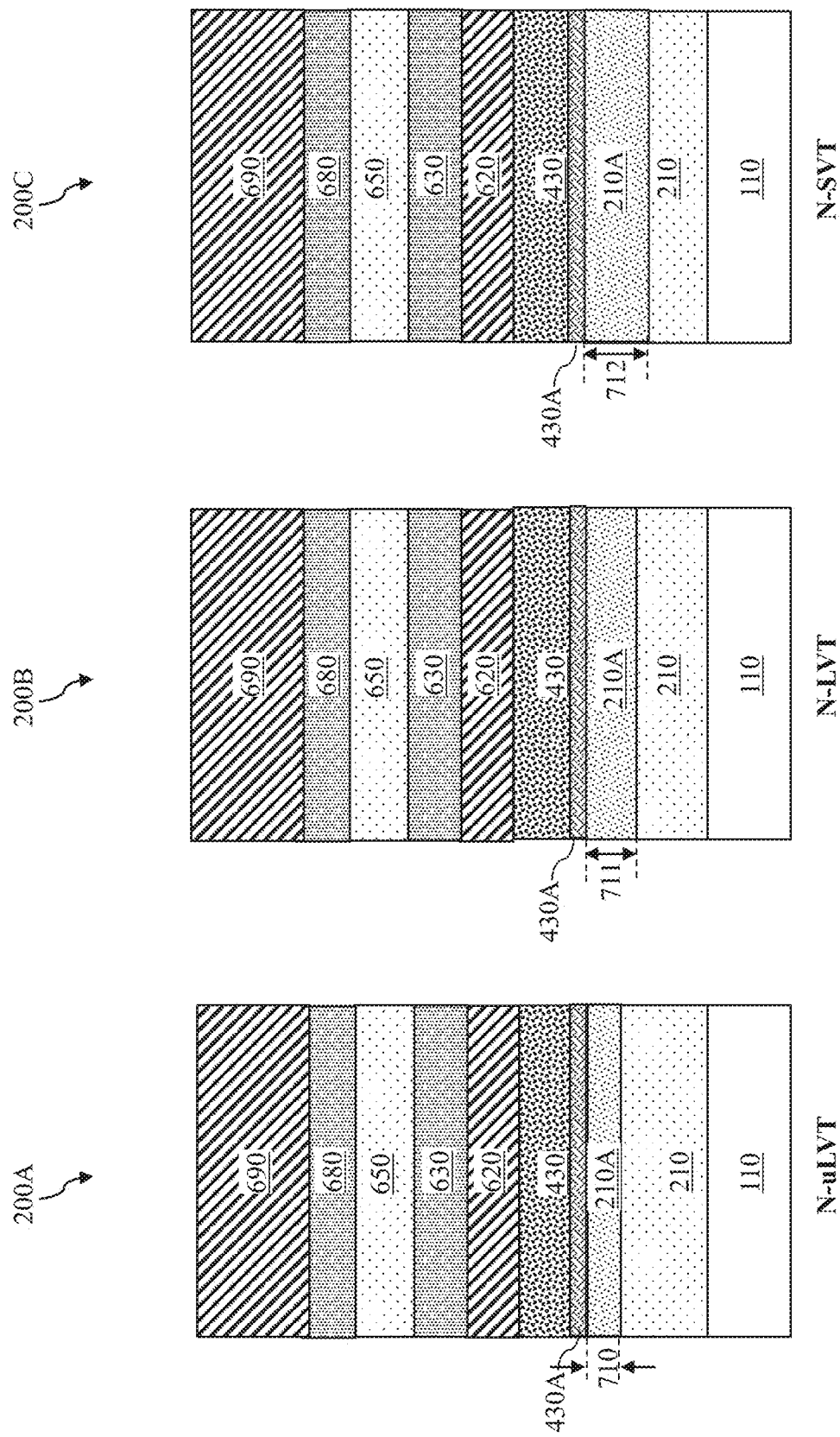

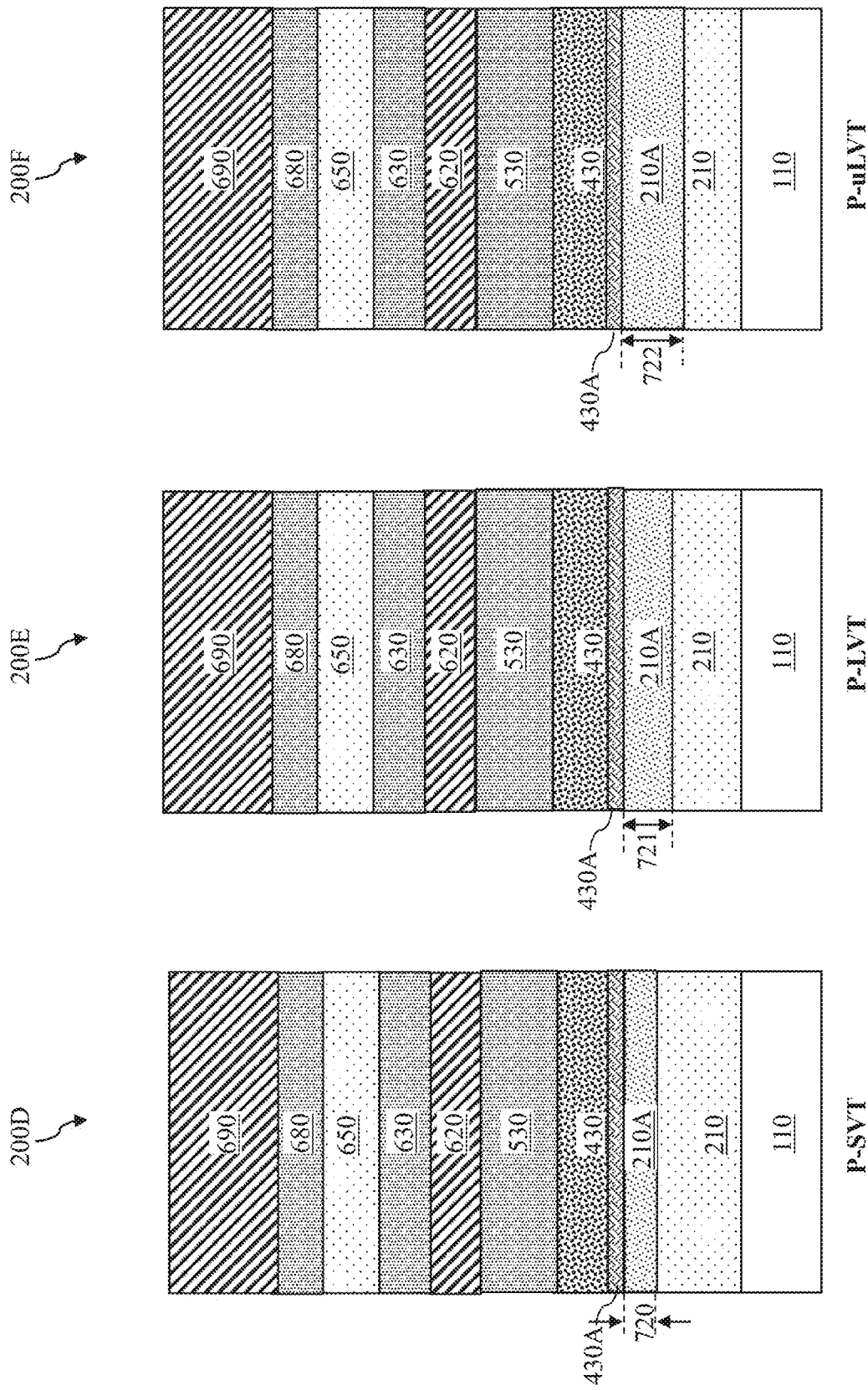

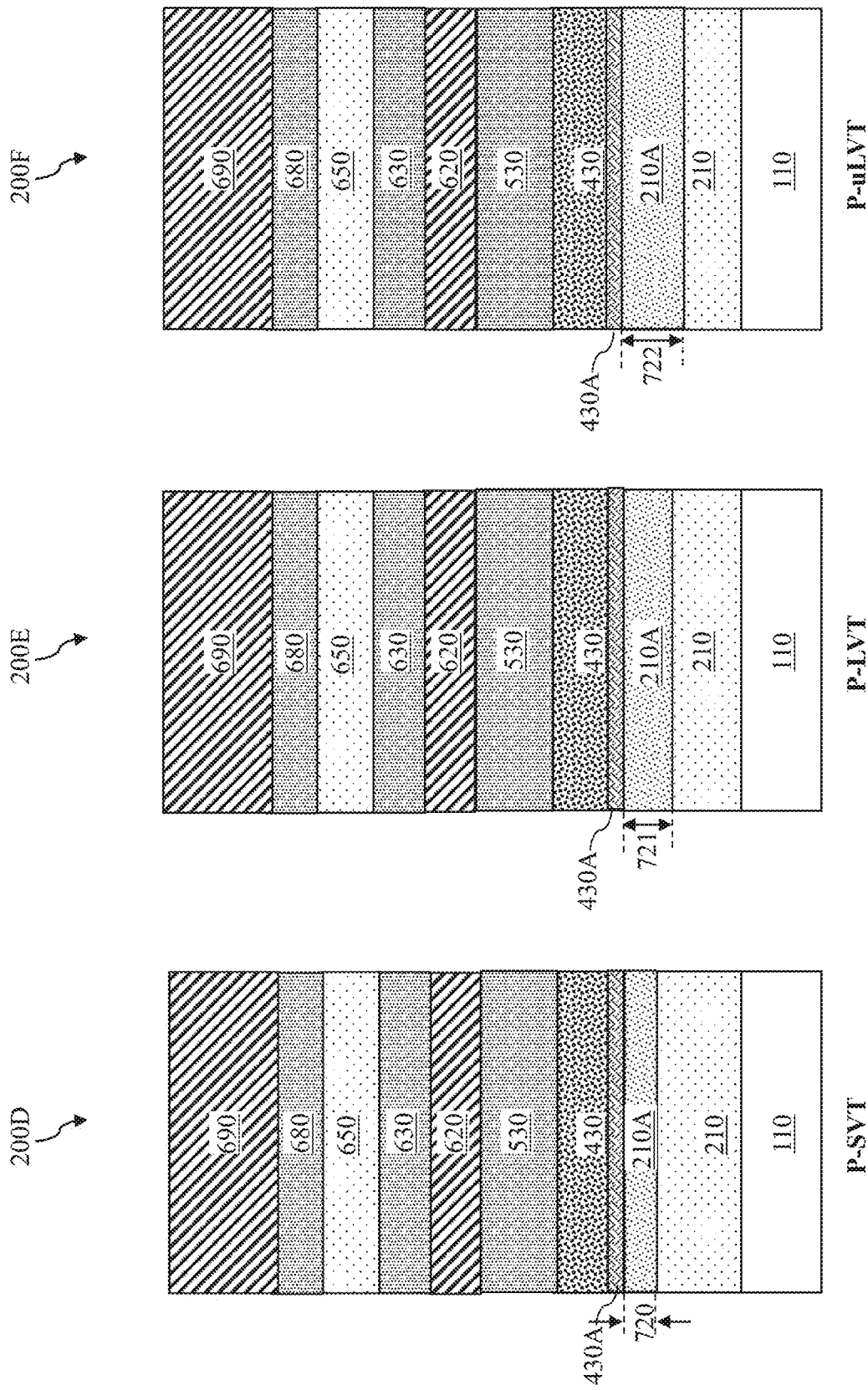

STRUCTURES FOR TUNING THRESHOLD VOLTAGE

PRIORITY DATA

This present application is utility U.S. Patent Application claiming priority to U.S. Provisional Patent Application No. 62/968,482, filed on Jan. 31, 2020, and entitled "Novel Gate Structures For Tuning Threshold Voltage", the disclosure of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, threshold voltage in conventional devices may be tuned by increasing the thicknesses of different work function metals of a gate electrode. However, as the device scaling down process continues, increasing the thicknesses of different work function metals may become unfeasible and/or may lead to various manufacturing difficulties.

Therefore, although conventional methods of tuning threshold voltages have generally been adequate, they have not been satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-21A, 2B-21B, 2C-21C, 2D-21D, 2E-21E, and 2F-21F and 22-23 are cross-sectional views of various embodiments of an IC device of at various stages of fabrication according to various aspects of the present disclosure.

DETAILED DESCRIPTION

Figure 1B:
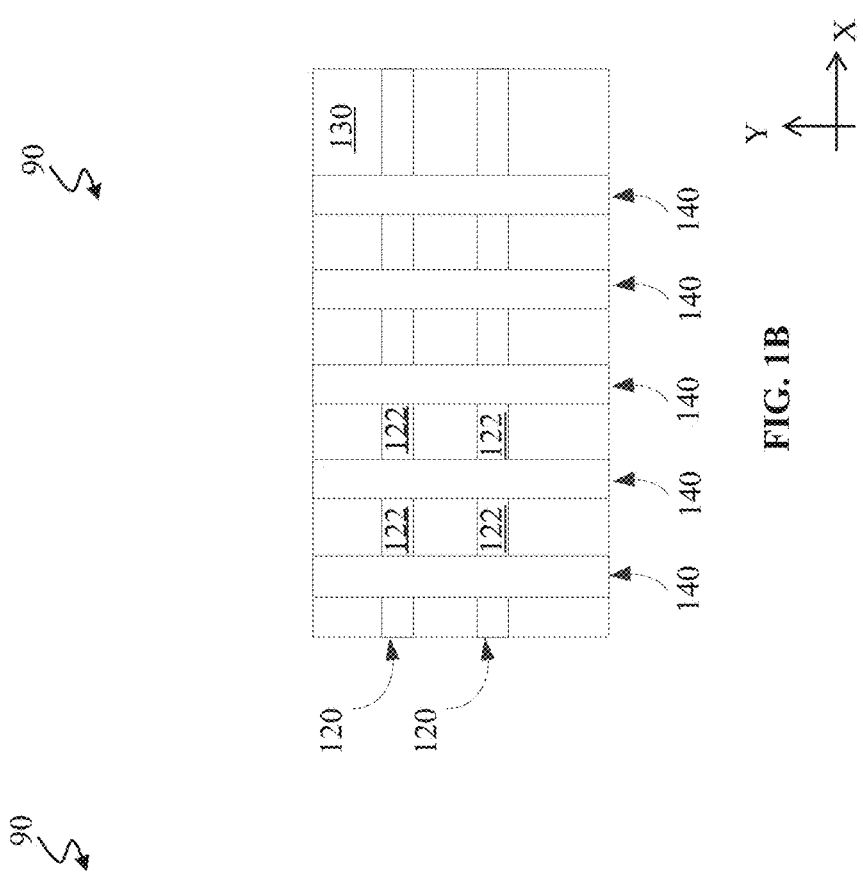
FIG. 1B is a planar top view of an IC device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, and more particularly to field-effect transistors (FETs), such as planar FETs, three-dimensional fin-line FETs (FinFETs), or gate-all-around (GAA) devices. One aspect of the present disclosure involves forming a dipole layer directly on an interfacial layer in a gate structure, and then using multiple interfacial-layer-patterning processes to achieve different threshold voltages for different devices. This improves the flexibility in tuning the threshold voltage and reduces gate resistance compared to conventional devices, as discussed below in more detail.

Figure 1A:
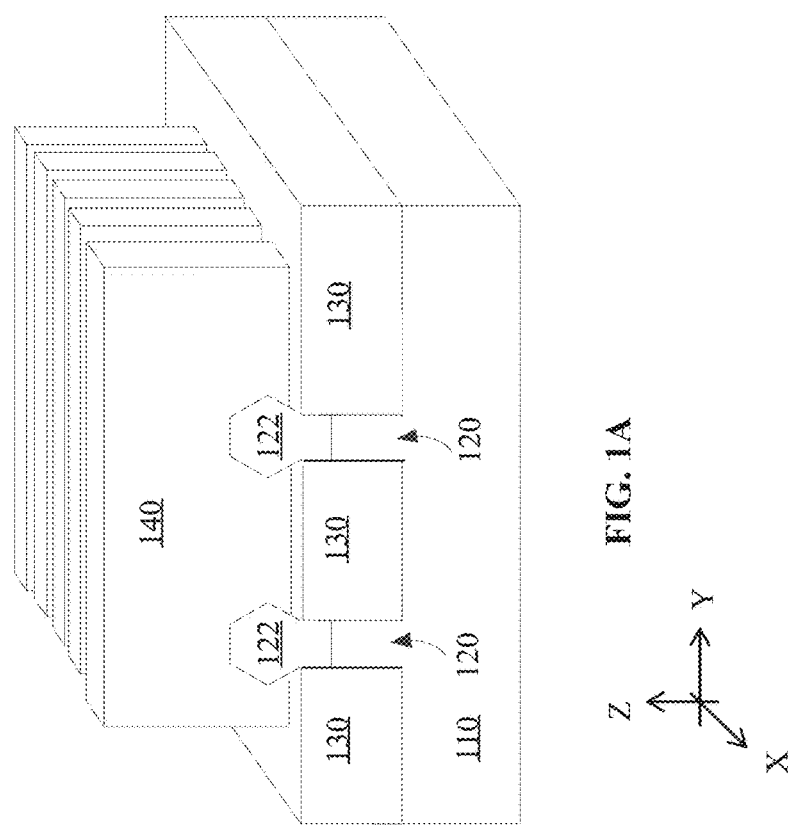
FIG. 1A is a perspective view of an IC device according to various aspects of the present disclosure.
Figure 2C:
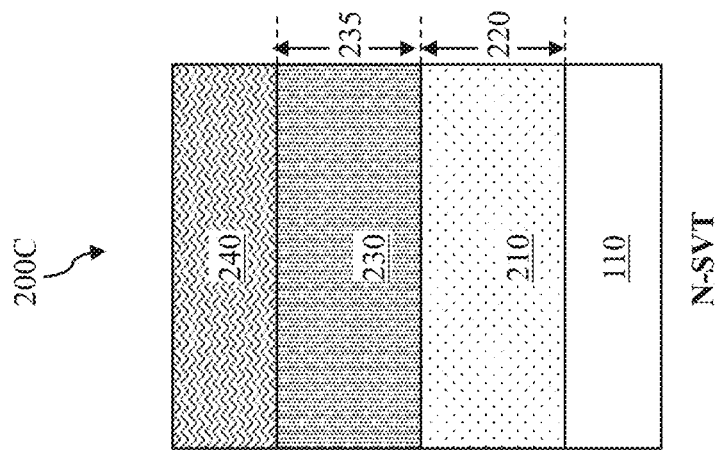
Figure 2B:
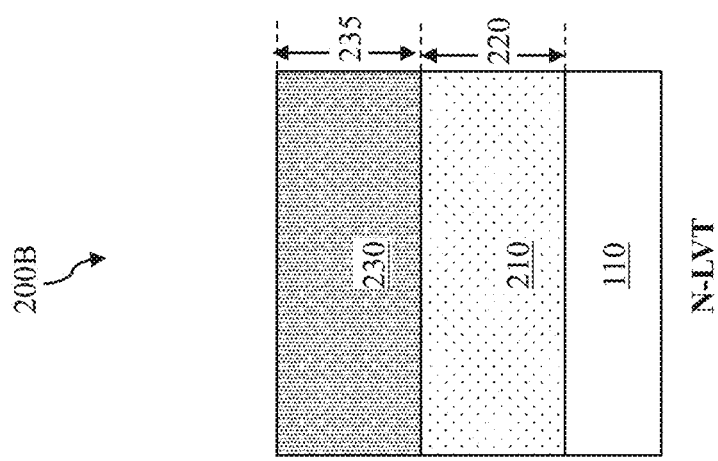
Figure 2A:
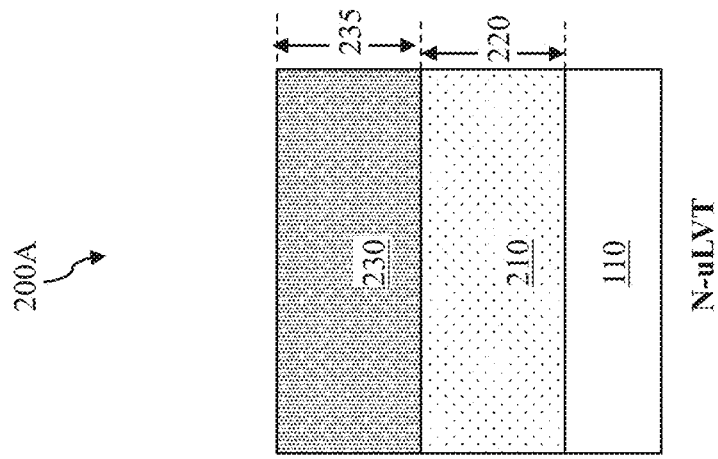
Figure 2F:
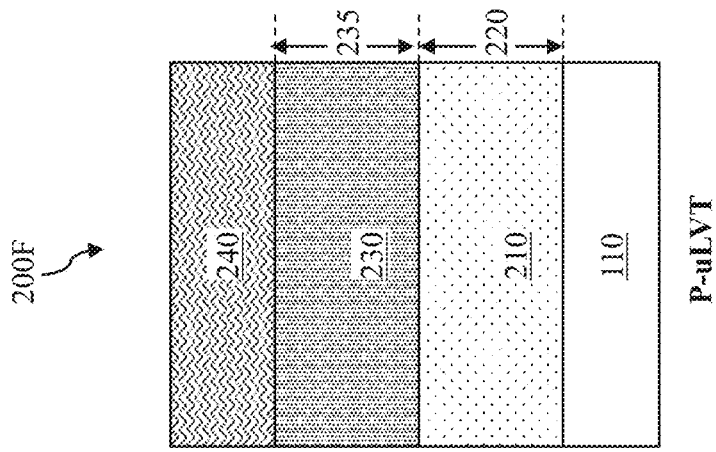
Figure 2E:
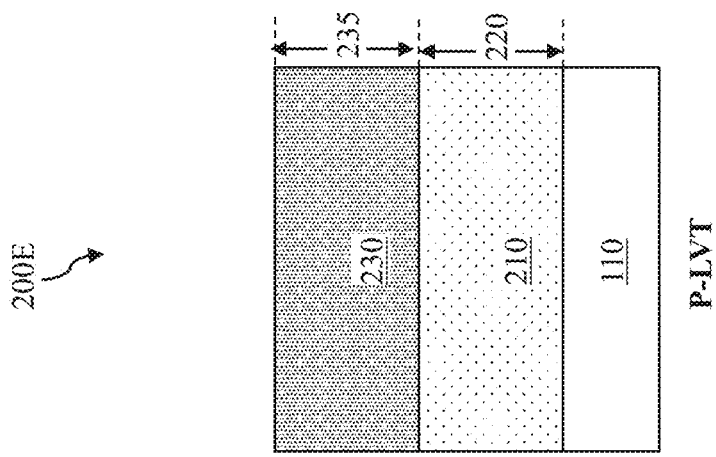
Figure 2D:
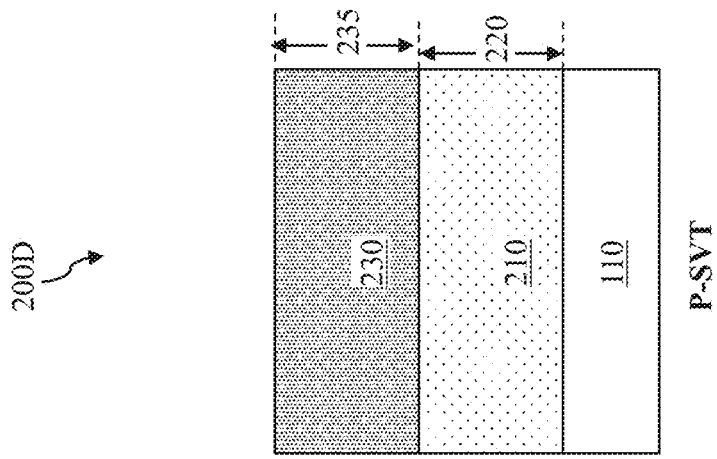
Figure 3F:
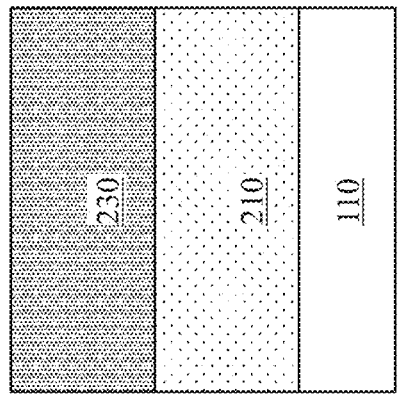
Figure 3E:
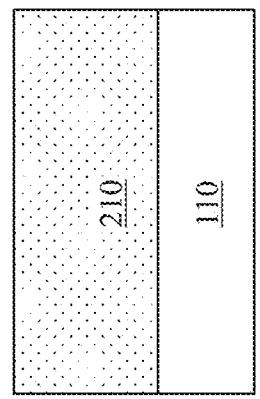
Figure 3D:
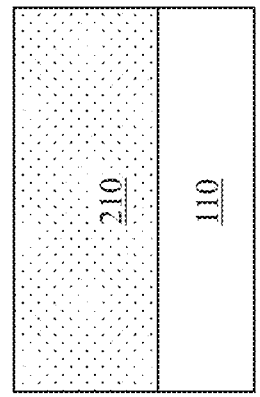
Figure 4C:
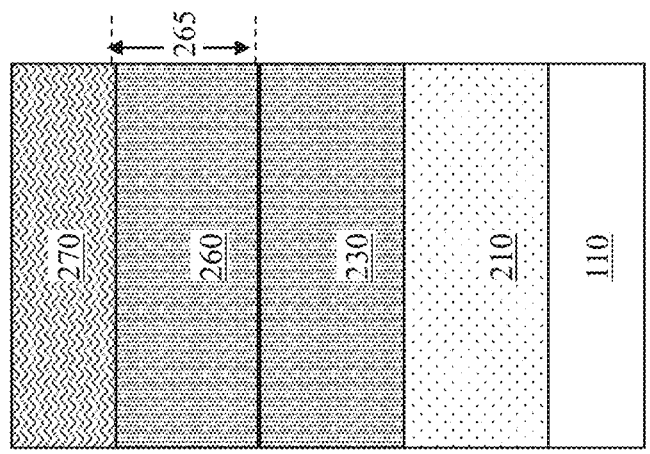
Figure 4B:
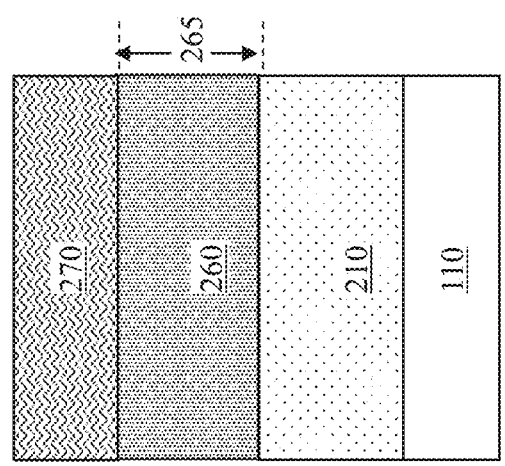
Figure 4A:
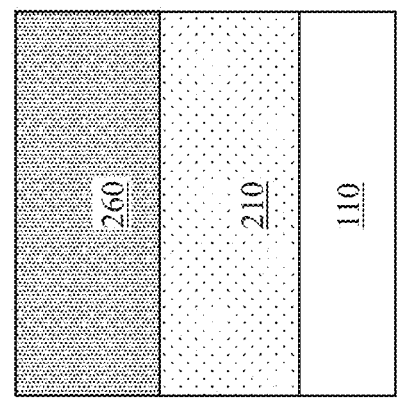
Figure 4F:
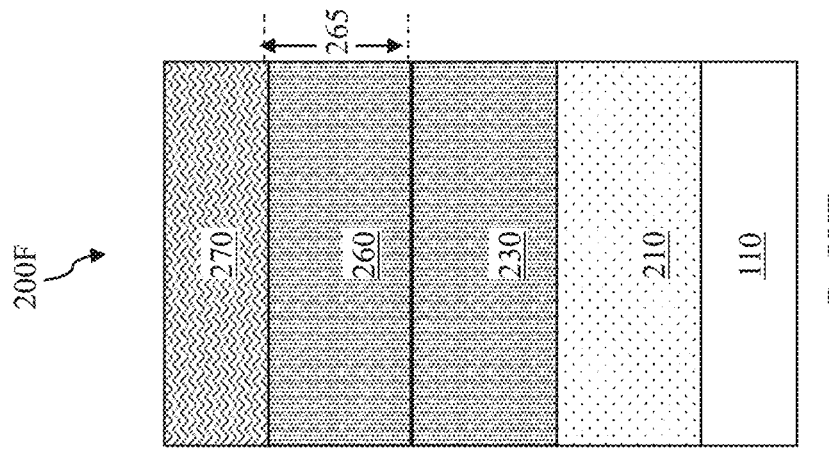
Figure 4E:
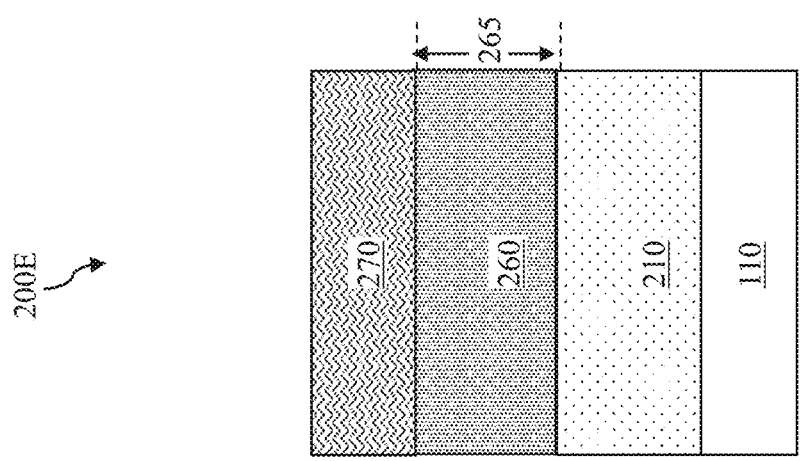
Figure 4D:
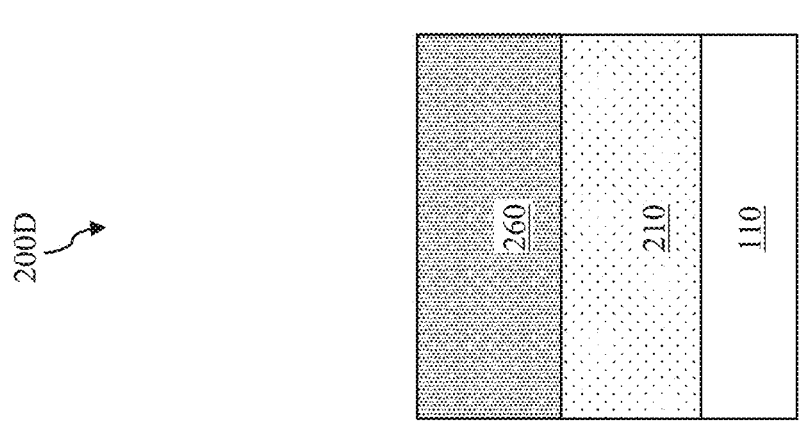
Figure 5C:
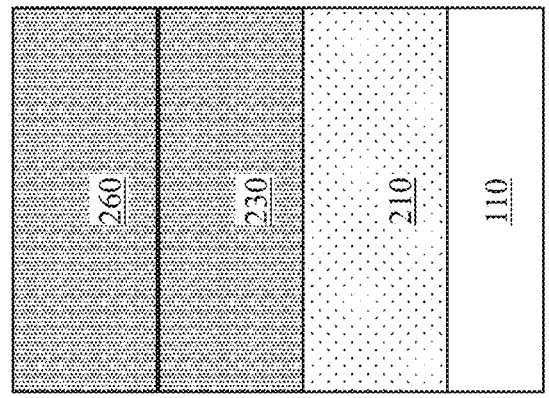
Figure 5B:
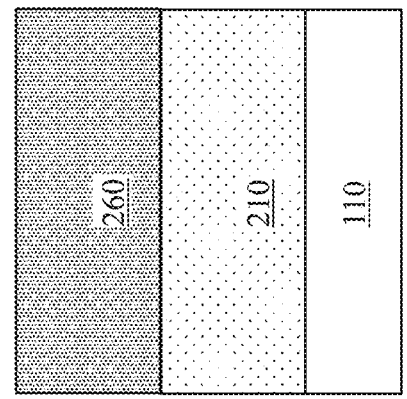
Figure 5A:
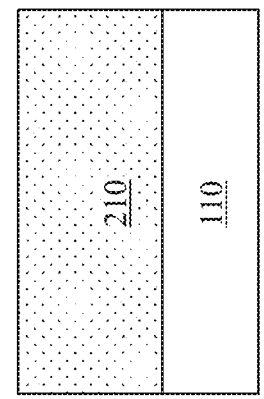
Figure 5F:
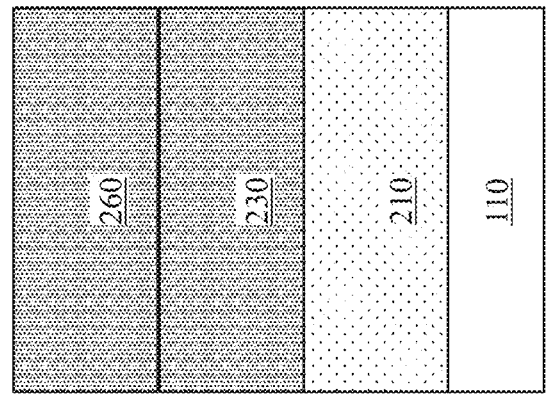
Figure 5E:
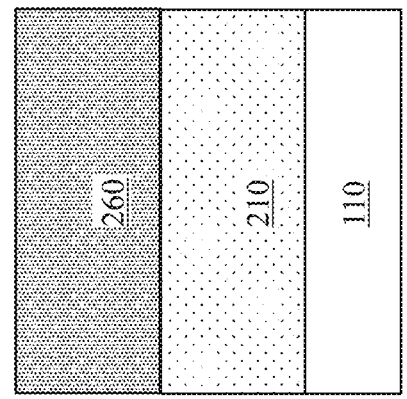
Figure 5D:
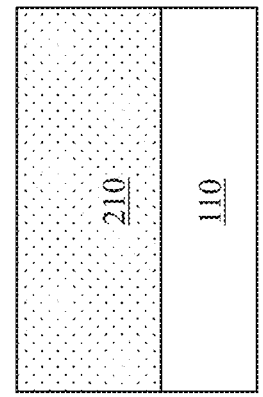

FIGS. 1A and 1B illustrate a three-dimensional perspective view and a top view, respectively, of a portion of an Integrated Circuit (IC) device 90. The IC device 90 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations, unless otherwise claimed. For example, although the IC device 90 as illustrated is a three-dimensional FinFET device, the concepts of the present disclosure may also apply to planar FET devices or GAA devices.

Referring to FIG. 1A, the IC device 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 are elongated fin-like structures that protrude upwardly out of the substrate 110. As such, the active regions 120 may be interchangeably referred to as fins 120 or fin structures 120 hereinafter. The fin structures 120 may be fabricated using suitable processes including photolithography and etch processes. The photolithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 120.

The IC device 90 also includes source/drain features 122 formed over the fins 120. The source/drain features 122 may include epi-layers that are epitaxially grown on the fin structures 120.

The IC device 90 further includes isolation structures 130 formed over the substrate 110. The isolation structures 130 electrically separate various components of the IC device 90. The isolation structures 130 may include silicon oxide, silicon nitride, silicon oxynitride, fluoride-doped silicate glass (FSG), a low-k dielectric material, and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The IC device 90 also includes gate structures 140 formed over and engaging the fins 120 on three sides in a channel region of each fin 120. The gate structures 140 may be dummy gate structures (e.g., containing an oxide gate dielectric and a polysilicon gate electrode), or they may be HKMG structures that contain a high-k gate dielectric and a metal gate electrode, where the HKMG structures are formed by replacing the dummy gate structures. Though not depicted herein, the gate structure 140 may include additional material layers, such as an interfacial layer over the fins 120, a capping layer, other suitable layers, or combinations thereof.

Referring to FIG. 1B, multiple fins 120 are oriented lengthwise along the X-direction, and multiple gate structure 140 are oriented lengthwise along the Y-direction, i.e., generally perpendicular to the fins 120. In many embodiments, the IC device 90 includes additional features such as gate spacers disposed along sidewalls of the gate structures 140, hard mask layer(s) disposed over the gate structures 140, and numerous other features.

FIGS. 2A-2F through FIGS. 21A-21F illustrate diagrammatic fragmentary cross-sectional side views of a portion of the IC device 90 at various stages of fabrication according to different embodiments of the present disclosure. For example, FIGS. 2A-21A illustrate diagrammatic fragmentary cross-sectional side views of a gate structure 200A fabricated according to an embodiment corresponding to an N-type transistor having an ultra-low threshold voltage (hereinafter referred to as N-uLVT). FIGS. 2B-21B illustrate diagrammatic fragmentary cross-sectional side views of a gate structure 200B fabricated according to an embodiment corresponding to an N-type transistor having a low threshold voltage (hereinafter referred to as N-LVT). FIGS. 2C-21C illustrate diagrammatic fragmentary cross-sectional side views of a gate structure 200C fabricated according to an embodiment corresponding to an N-type transistor having a standard threshold voltage (hereinafter referred to as N-SVT). It is understood that the threshold voltage of the N-uLVT is smaller than the threshold voltage of the N-LVT, and the threshold voltage of the N-LVT is smaller than the threshold voltage of the N-SVT.

Meanwhile, FIGS. 2D-21D illustrate diagrammatic fragmentary cross-sectional side views of a gate structure 200D fabricated according to an embodiment corresponding to a P-type transistor having a standard threshold voltage (hereinafter referred to as P-SVT). FIGS. 2E-21E illustrate diagrammatic fragmentary cross-sectional side views of a gate structure 200E fabricated according to an embodiment corresponding to a P-type transistor having a low threshold voltage (hereinafter referred to as P-LVT). FIGS. 2F-21F illustrate diagrammatic fragmentary cross-sectional side views of a gate structure 200F fabricated according to an embodiment corresponding to a P-type transistor having an ultra-low threshold voltage (hereinafter referred to as P-uLVT). It is understood that since PFET devices have negative threshold voltages, a magnitude or absolute value of a threshold voltage of the P-uLVT is smaller than the magnitude or absolute value of the threshold voltage of the P-LVT, and the magnitude or absolute value of the threshold voltage of the P-LVT is smaller than the magnitude or absolute value of the threshold voltage of the P-SVT.

It is understood that the gate structures 200A-200F may be formed on the same wafer and/or may be parts of the same IC chip in some embodiments. As such, at least some of the fabrication processes discussed below may be performed to all the gate structure 200A-200F simultaneously. In FinFET embodiments, the gate structures 200A-200F may also be each formed over fin structures (e.g., the fin structures 120 of FIGS. 1A-1B), such that the gate structures 200A-200F each wrap around a portion of the fin structures. For example, the gate structures 200A-200F may wrap around channel regions of the fin structures, thereby interposing source regions and drain regions of the fin structure.

At the stage of fabrication shown in FIGS. 2A-2F, the gate structures 200A-200F each include an interfacial layer (hereinafter interchangeably referred to as IL) 210 that is formed over a portion of the substrate 110 (for example over the fin structures 120) of FIG. 1A. In some embodiments, the IL 210 includes silicon oxide. In other embodiments, the IL 210 may include another suitable type of dielectric material. The IL 210 has a thickness 220 (measured in the Z-direction of FIG. 1A). In some embodiments, the thickness 220 is in a range between about 3 angstroms and about 15 angstroms.

Still referring to FIGS. 2A-2F, a hard mask layer 230 is formed over the IL 210 in the gate structures 200A-200F. In some embodiments, the hard mask layer 230 include titanium nitride. In some embodiments, the hard mask layer 230 is formed by an atomic layer deposition (ALD) process with about 20 to about 50 cycles of deposition and at a temperature range of between about 400 degrees Celsius and about 450 degrees Celsius. Such a deposition process may form the hard mask layer 230 with a thickness 235 that is in a range between about 10 angstroms and about 25 angstroms. This range for the thickness 235 is not randomly chosen but specifically configured to effectively set a distance or spacing between the IL 210 and the dipole layer to be formed thereover. As will be discussed in more detail below, such a distance will help tune the threshold voltage of the N-SVT and P-uLVT transistors.

A patterned photoresist layer 240 is formed over the hard mask layer 230 in the gate structures 200C and 200F corresponding to the N-SVT and P-uLVT embodiments, respectively, but not over the hard mask layer 230 in the gate structures 200A-200B and 200D-200E. In some embodiments, the patterned photoresist layer 240 may include a photo-sensitive material and an anti-reflective material. The patterned photoresist layer 240 may be used to pattern the hard mask layer 230 underneath.

Referring now to FIGS. 3A-3F, a photolithography process may be performed to pattern the hard mask layer 230. The patterned photoresist layer 240 may protect the portions of the hard mask layer 230 underneath, while the exposed portions of the hard mask layer 230 are removed. In this manner, the remaining portions of the hard mask layer 230 are formed over the IL 210 in the gate structures 200C and 200F, but not over the IL 210 in the gate structures 200A-200B and 200D-200E. As will be discussed in more detail below, the present disclosure leaves the hard mask layer 230 remaining in the gate structures 200C and 200F to serve as an extra diffusion barrier, or to increase a distance between the IL 210 and a dipole layer to be formed thereover in a later fabrication process. After the patterning of the hard mask layer 230, the patterned photoresist layer 240 is removed, for example using a photoresist ashing or stripping process.

Referring now to FIGS. 4A-4F, a hard mask layer 260 is formed over the IL 210 in the gate structures 200A-200F. In some embodiments, the hard mask layer 260 may include the same material (or a substantially similar material) as the hard mask layer 230. For example, the hard mask layer 260 may include titanium nitride. In other embodiments, the hard mask layer 260 may include a different type of material. In some embodiments, the hard mask layer 260 is formed by an ALD process with about 20 to about 50 cycles of deposition and at a temperature range of between about 400 degrees Celsius and about 450 degrees Celsius. Such a deposition process may form the hard mask layer 260 with a thickness 265 that is in a range between about 10 angstroms and about 25 angstroms. This range for the thickness 265 is not randomly chosen but specifically configured to effectively set a distance or spacing between the IL 210 and the dipole layer to be formed thereover. As will be discussed in more detail below, such a distance will help tune the threshold voltage of the N-LVT, N-SVT, P-LVT, and P-uLVT transistors.

A patterned photoresist layer 270 is formed over the hard mask layer 230 in the gate structures 200B-200C and 200E-200F corresponding to the N-LVT, N-SVT, P-LVT, and P-uLVT embodiments, respectively, but not over the hard mask layer 260 in the gate structures 200A and 200D corresponding to the N-uLVT and P-SVT embodiments. In some embodiments, the patterned photoresist layer 270 may include a photo-sensitive material and an anti-reflective material. The patterned photoresist layer 270 may be used to pattern the hard mask layer 260 underneath.

Referring now to FIGS. 5A-5F, a photolithography process may be performed to pattern the hard mask layer 260. The patterned photoresist layer 270 may protect the portions of the hard mask layer 260 underneath, while the exposed portions of the hard mask layer 260 are removed. In this manner, the remaining portions of the hard mask layer 260 are disposed over the IL 210 in the gate structures 200D-200C and 200E-200F, but not over the IL 210 in the gate structures 200A and 200D. Again, the present disclosure leaves the hard mask layer 230 remaining in the gate structures 200B-200C and 200E-200F to serve as another extra diffusion barrier, or to further increase a distance between the IL 210 and the dipole layer to be formed thereover in the later fabrication process. The different distances between the IL 210 and the dipole layer will help tune different threshold voltages for these different transistors. After the patterning of the hard mask layer 260, the patterned photoresist layer 270 is removed, for example using a photoresist ashing or stripping process.

Referring now to FIGS. 6A-6F, a dipole deposition process 290 is performed to deposit a dipole layer 300 on each of the gate structures 200A-200F. In more detail, the dipole layer 300 is deposited directly on the IL 210 in the gate structures 200A and 200D (corresponding to the N-uLVT and P-SVT embodiments, respectively), and the dipole layer 300 is deposited directly on the hard mask layer 260 in the gate structures 200B-200C and 200E-200F (corresponding to the N-LVT, N-SVT, P-LVT, and P-uLVT embodiments, respectively).

In some embodiments, the dipole layer 300 may include a dipole material suitable for N-type devices (also referred to as an N-type dipole material), which may include a metal oxide material such as lanthanum oxide ($La_2O_3$), yttrium oxide ($Y_2O_3$), magnesium oxide (MgO), strontium oxide (SrO), or combinations thereof, as non-limiting examples. The metal oxide species in the metal oxide material forms dipole moments with the species (e.g., silicon oxide) of the IL 210, thereby creating differentials in electrical potential of the overall gate structures 200A-200F. In the present disclosure, such differentials may affect the work function, and therefore the threshold voltage Vt, of the gate structures 200A-200F, without needing to adjust the type(s) and/or number of work function metal layers (to be formed in later fabrication processes) of the gate structures 200A-200F. For NFET devices such as the gate structures 200A-200C, the N-type dipole material may decrease the magnitude of the threshold voltage Vt. For PFET devices such as the gate structures 200D-200F, the N-type dipole material may increase the magnitude of the threshold voltage Vt. In alternative embodiments where a P-type dipole material is used to implement the dipole layer 300, the magnitude of the threshold voltage Vt will be increased for NFET devices such as the gate structures 200A-200C but will be decreased for PFET devices such as the gate structures 200D-200F.

In some embodiments, the dipole deposition process 290 includes an ALD process. In some embodiments, the ALD process uses $La(fAMD)_3$ or $La(thd)_3$ and $O_3$ as precursors. The ALD process allows a thickness 310 of the deposited dipole layer 300 to be precisely controlled. In some embodiments, the thickness 310 is in a range between about 5 angstroms and about 15 angstroms.

Note that since the dipole layer 300 is directly deposited on the upper surface of the IL 210 for the gate structures 200A and 200D, the dipole layer 300 will have the strongest effect on the IL 210 for the gate structures 200A and 200D. Meanwhile, for the gate structures 200B and 200E, the dipole layer 300 is separated from the IL 210 by the hard mask layer 260, which as discussed above has a thickness 265. Thus, the dipole layer 300 may have a weaker effect on the IL 210 for the gate structures 200B and 200E. Lastly, for the gate structures 200C and 200F, the dipole layer 300 is separated from the IL 210 by the hard mask layer 260 and the hard mask layer 230, which may have a combined thickness 330 (e.g., a sum of the thickness 235 and 265 discussed above). Since the combined thickness 330 is greater than the thickness 265, the dipole layer 300 may have the weakest effect on the IL 210 for the gate structures 200C and 200F.

As such, the multiple patterning processes discussed above results in different spacings or separations between the IL 210 and the dipole layer 300 for the different types of transistors. For the N-uLVT and P-SVT transistors, there is no separation between the dipole layer 300 and the IL 210, and as such, the dipole layer 300 may exhibit the strongest effect to the IL 210 for these transistors. For the N-LVT and P-LVT transistors, there is an intermediate amount of separation (caused by the presence of the hard mask layer 260) between the dipole layer 300 and the IL 210, and as such, the dipole layer 300 may exhibit an intermediate amount of effect to the IL 210 for these transistors. For the N-SVT and P-uLVT transistors, there is a relatively large separation between the dipole layer 300 and the IL 210, and as such, the dipole layer 300 may exhibit the weakest effect to the IL 210 for these transistors.

Referring now to FIGS. 7A-7F, a dipole drive-in process 350 is performed to the gate structures 200A-200F. In some embodiments, the dipole drive-in process 350 may include a thermal process such as an annealing process. In some embodiments, the annealing process may be performed at an annealing temperate between about 600 degrees Celsius and about 800 degrees Celsius, while using a nitrogen gas. Such a high annealing temperature causes the metal ions in the dipole layers 300 to penetrate into (or react with) the IL 210. The metal ions may increase the polarity of the IL 210, and thus can be used to adjust the threshold voltage Vt of the gate structures 200A-200F. The dipole penetration may be visually represented in FIGS. 7A-7F as dipole-penetrated portions 210A of the IL 210.

As discussed above, for the NFETs, the gate structures 200A, 200B, and 200C have different amounts of separation between the IL 210 and the dipole layer 300, respectively, with the gate structure 200A having the least amount of separation between its IL 210 and its dipole layer 300, and the gate structure 200C having the greatest amount of separation between its IL 210 and its dipole layer 300. As a result, the IL 210 of the gate structure 200A may have a greater degree of dipole penetration than the IL 210 of the gate structure 200B, and the IL 210 of the gate structure 200B may have a greater degree of dipole penetration than the IL 210 of the gate structure 200C. Similarly, for the PFETs, the IL 210 of the gate structure 200D may have a greater degree of dipole penetration than the IL 210 of the gate structure 200E, and the IL 210 of the gate structure 200E may have a greater degree of dipole penetration than the IL 210 of the gate structure 200F.

The differences in the dipole penetration may be represented by the different depths in which the dipole-penetrated portions 210A extend into the IL 210. For example, dipole-penetrated portions 210A of the gate structures 200A-200C may have depths 370-372, and the dipole-penetrated portions 210A of the gate structures 200D-200F may have depths 380-382, respectively. The depths 370-372 and 380-382 may also be referred to as thicknesses of the dipole-penetrated portions 210A. In some embodiments, the depths 370-372 and 380-382 may each be in a range between about 2 angstroms and about 3 angstroms.

Due to the presence of the hard mask layer 260 in the gate structures 200B and 200E and the presence of the hard mask layers 260 and 230 in the gate structures 200C and 200F, the depth 370 is greater than the depth 371, which is greater than the depth 372, and the depth 380 is greater than the depth 381, which is greater than the depth 382. Expressed mathematically, the depth 370>the depth 371>the depth 372, and the depth 380>the depth 381>the depth 382. Again, this is because the lack of a hard mask layer between the IL 210 and the dipole layer 300 in the gate structures 200A and 200D allows the metal ions of the dipole layer 300 to be driven the deepest into the IL 210, and the presence of the hard mask layer 260 between the IL 210 and the dipole layer 300 in the gate structures 200B and 200E allows the metal ions of the dipole layer 300 to be driven less deep into the IL 210, and that the presence of the two hard mask layers 260 and 230 between the IL 210 and the dipole layer 300 in the gate structures 200C and 200F allows the metal ions of the dipole layer 300 to be driven the least deep into the IL 210. The different depths 370-372 allow the threshold voltages Vt to be tuned differently for the gate structures 200A-200C. Likewise, the different depths 380-382 allow the threshold voltages Vt to be tuned differently for the gate structures 200D-200F.

It is understood that within each dipole-penetrated portion 210A, the concentration of the dipole material (e.g., the metal ions) may increase as it gets closer to the dipole layer 300. In other words, the concentration of the dipole material may reach a peak at an interface between the dipole layer 300 and the dipole-penetrated portion 210A, and then it gradually declines as the distance from the interface (or from the upper surface of the dipole-penetrated portion) increases (e.g., as it gets deeper toward the substrate 110).

Note that the depth 370 may or may not be equal to the depth 380, the depth 371 may or may not be equal to the depth 381, and the depth 372 may or may not be equal to the depth 382. Furthermore, the value of the depth 372 and 382 may approach 0 in some embodiments. In other words, the hard mask layers 230 and 260 substantially block or prevent the penetration of the material from the dipole layer 300 into the IL 210.

It is also understood that in some embodiments, the differences between the gate structures 200A-200C (and the gate structures 200D-200F) in terms of efficacy of the dipole drive-in may be manifested by the different concentration levels of the dipole material (e.g., the metal ions) in the dipole-penetrated portions 210A of the IL 210, instead of, or in addition to, the different depths 370-372 and 380-382. In other words, the dipole metal ion concentration in the dipole-penetrated portion 210A of the gate structure 200A may exceed dipole metal ion concentration in the dipole-penetrated portion 210A of the gate structure 200B, and the dipole metal ion concentration in the dipole-penetrated portion 210A of the gate structure 200B may exceed dipole metal ion concentration in the dipole-penetrated portion 210A of the gate structure 200C. Similarly, the dipole metal ion concentration in the dipole-penetrated portion 210A of the gate structure 200D may exceed dipole metal ion concentration in the dipole-penetrated portion 210A of the gate structure 200E, and the dipole metal ion concentration in the dipole-penetrated portion 210A of the gate structure 200E may exceed dipole metal ion concentration in the dipole-penetrated portion 210A of the gate structure 200F. In some embodiments, the differences in the dipole metal ion concentration levels between the gate structures 200A-200F may exist regardless of whether the differences between the depths 370-372 exist (or whether the differences between the depths 380-382 exist), or vice versa.

Referring now to FIGS. 8A-8F, a dipole removal process 400 is performed to remove the remaining portions of the dipole layers 300, for example the portions of the dipole layer 300 that have not or did not react with the IL 210. In some embodiments, the dipole removal process 400 includes an etching process, such as a wet etching process, a dry etching process, or a combination thereof. In some embodiments, an etchant used in such an etching process may include hydrochloric acid (HCl), alkali (NH$_4$), oxidant, or another suitable etchant.

Referring now to FIGS. 9A-9F, a hard mask layer removal process 410 is performed to remove the hard mask layers 260 and 230. In some embodiments, the hard mask layer removal process 410 includes an etching process, such as a wet etching process. After the performance of the hard mask layer removal process 410, the dipole-penetrated portions 210A of the IL 210 are exposed for all of the transistors discussed herein.

Referring now to FIGS. 10A-10F, a gate dielectric deposition process 420 is performed to form a gate dielectric layer 430 over the dipole-penetrated portions 210A of the IL 210. In some embodiments, the gate dielectric deposition process 420 includes an ALD process in order to control a thickness of the deposited gate dielectric layer 430 with precision. In some embodiments, the ALD process is performed using between about 20 and 40 deposition cycles, at a temperature range between about 200 degrees Celsius and about 300 degrees Celsius. In some embodiments, the ALD process uses HfCl$_4$ and/or H$_2$O as precursors, and/or adds LaCl$_3$ as a lanthanum doping source. Such an ALD process may form the gate dielectric layer to have a thickness 440, which may be in a range between about 10 angstroms and about 20 angstroms.

In some embodiments, the gate dielectric layer 430 includes a high-k dielectric material, which may refer to dielectric materials having a high dielectric constant that is greater than a dielectric constant of silicon oxide ($k \approx 3.9$). Exemplary high-k dielectric materials include HfO2, HfSiO, HfSiON, HfTaO, HfTiO, HfZrO, ZrO$_2$, Al$_2$O$_3$, HfO$_2$—Al$_2$O$_3$, TiO$_2$, Ta$_2$O$_5$, La$_2$O$_3$, Y$_2$O$_3$, or combinations thereof. In other embodiments, the gate dielectric layer 430 may include a non-high-k dielectric material such as silicon oxide.

It is understood that since the bottom surface of the gate dielectric layer 430 forms an interface with the dipole-penetrated portion 210A of the IL below, some amount of the dipole material (e.g., metal ions) may diffuse from the dipole-penetrated portion 210A into the gate dielectric layer 430. As such, the bottom portion of the gate dielectric layer 430 may have a greater content of the dipole material than the rest of the gate dielectric layer 430.

Referring now to FIGS. 11A-11F, a plurality of deposition processes 450 may be performed to form a protective layer 460 over the gate dielectric layer 430, and to form a capping layer 470 over the protective layer 460. In some embodiments, the deposition processes 450 include ALD processes. In some embodiments, the protective layer 460 includes TiN, and the capping layer 470 includes TiSiN or SiO$_2$. In some embodiments, the protective layer 460 or the capping layer 470 may have a thickness less than about 20 angstroms.

Referring now to FIGS. 12A-12F, an annealing process 480 may be performed. In some embodiments, the annealing process 480 may include an in-situ post metal annealing (iPMA) process. The annealing process 480 improves the quality of the gate dielectric layer 430. The protective layer 460 and/or the capping layer 470 may help prevent a diffusion of oxygen into the gate dielectric layer 430 during the annealing process 480, since the gate dielectric layer 430 would otherwise be exposed to an oxygen-containing environment during the annealing process 480 had the protective layer 460 and the capping layer 470 not been formed. Oxygen diffusion into the gate dielectric layer 430 could degrade the quality of the gate dielectric layer 430, and therefore the formation of the protective layer 460 and the capping layer 470 to prevent such undesirable oxygen diffusion helps to improve the quality of the gate dielectric layer 430.

It is understood that the annealing process may cause further diffusion of the dipole material from the dipole-penetrated portion 210A to the gate dielectric layer 430. As such, the gate dielectric layer 430 may also have a dipole-penetrated portion 430A at or near its bottom surface. The presence of the dipole-penetration portion 430A at the bottom of the gate dielectric layer 430 may also be one of the unique physical characteristics of gate structures fabricated according to the embodiments of the present disclosure.

Referring now to FIGS. 13A-13F, a deposition process 500 may be performed to form a capping layer 510 over the capping layer 470. In some embodiments, the deposition process 500 includes an ALD process. In some embodiments, the capping layer 510 includes silicon oxide or titanium silicon nitride.

Referring now to FIGS. 14A-14F, an annealing process 520 may be performed, which further improves the quality of the gate dielectric layer 430. Again, the annealing process 520 may be performed in an oxygen-containing environment. Similar to the capping layer 470 and the protective layer 460, the capping layer 510 prevents oxygen from being diffused into the gate dielectric layer 430. As such, the quality of the gate dielectric layer 430 is improved.

Referring now to FIGS. 15A-15F, the capping layers 510 and 470 and the protective layer 460 are removed, for example using one or more etching processes. At this stage of fabrication, the gate dielectric layers 430 (which have good quality due at least in part to the performance of the annealing processes 480 and 520) are exposed.

Referring now to FIGS. 16A-16F, a P-type work function metal layer 530 is formed over the gate dielectric layer 430 in each of the gate structures 200A-200F. The P-type work function metal layer 530 may be formed using a deposition process ALD, CVD, PVD, or combinations thereof. In some embodiments, the P-type work function metal layer 530 may be formed in an ALD process using $TiCl_4$ and/or $NH_3$ as precursors. In some embodiments, the P-type work function metal layer 530 include titanium nitride (TiN). In other embodiments, the P-type work function metal layer 530 may include a different type of work function metal material, such as TaN, or WCN. In some embodiments, the P-type work function metal layer 530 may be formed to have a thickness in a range between about 10 angstroms and about 25 angstroms.

A patterned photoresist layer 540 is formed over the P-type work function metal layer 530 in the gate structures 200D-200F corresponding to the P-SVT, P-LVT, and P-uLVT embodiments, respectively, but not over the P-type work function metal layer 530 in the gate structures 200A-200C corresponding to the N-uLVT, N-LVT, and N-SVT embodiments, respectively. In some embodiments, the patterned photoresist layer 540 may include a photo-sensitive material and an anti-reflective material. The patterned photoresist layer 540 may be used to pattern the P-type work function metal layer 530 underneath.

Referring now to FIGS. 17A-17F, a lithography process 560 may be performed to pattern the P-type work function metal layer 530. The patterned photoresist layer 540 may protect the portions of the P-type work function metal layer 530 underneath, while the exposed portions of the P-type work function metal layer 530 are removed. In this manner, the remaining portions of the P-type work function metal layer 530 are formed over the gate dielectric layer 430 in the gate structures 200D-200F, but not over the gate dielectric layer 430 in the gate structures 200A-200C. After the patterning of the P-type work function metal layer 530, the patterned photoresist layer 540 is removed, for example using a photoresist ashing or stripping process. The remaining P-type work function metal layer 530 serves as a part of the gate electrode for the gate structures 200D-200F to tune its work function.

Referring now to FIGS. 18A-18F, a plurality of deposition processes 600 may be performed to form an N-type work function metal structure for the gate structures 200A-200F. For example, the N-type work function metal structure may include a protective layer 610 formed over the gate dielectric layer 430 for the gate structures 200A-200C and over the P-type work function metal layer 530 for the gate structures 200D-200F, an N-type work function metal layer 620 formed over the protective layer 610, and a protective layer 630 formed over the N-type work function metal layer 620. The protective layer 610 may prevent oxidation of the N-type work function metal layer 620 caused by the gate dielectric layer 430. In some embodiments, the protective layer 610 of the gate structures 200D-200F are each thicker than the protective layer 610 of the gate structures 200A-200C, which helps the protective layer 610 prevent oxidation better. The protective layer 630 prevents or substantially reduces oxygen diffusion into the N-type work function metal layer 620 from above. The N-type work function metal layer 620 serves as a part of the gate electrode for the gate structures 200A-200C to tune its work function.

In some embodiments, the protective layer 610 and the protective layer 630 may each include TiN, and the N-type work function metal layer 620 may include titanium aluminum carbide (TiAlC). As such, the N-type work function metal structure may include a sandwich-like structure, where the N-type work function metal layer 620 is sandwiched in between two protective layers 610 and 630. In other embodiments, the N-type work function metal layer 620 may include an aluminum-based work function metal, such as TiAl, TaAl, or TaAlC. An oxygen content in the N-type work function metal structure is less than about 1%. A capping layer 650 may also be formed over the protective layer 630. The capping layer 650 may include silicon oxide in some embodiments.

In some embodiments, the protective layer 610, the N-type work function metal layer 620, the protective layer 630, and the capping layer 650 may all be formed in the same tool with a high vacuum system in an in-situ process. For example, the protective layer 610 may be formed in a first chamber of the tool in an ALD process. The wafer containing the gate structures 200A-200F may then be transferred (under substantially vacuum conditions) to a second chamber of the tool, where the N-type work function metal layer 620 is formed in another ALD process. Silane gas ($SiH_4$) soaking may also be used to prevent oxidation of the N-type work function metal layer 620. Thereafter, the wafer containing the gate structures 200A-200F may be transferred (again under substantially vacuum conditions) to a third chamber of the tool, where the protective layer 630 is formed in yet another ALD process. The capping layer 650 may also be formed in the third chamber of the tool.

Referring now to FIGS. 19A-19F, a plurality of deposition processes 670 are performed to form a glue layer 680 over the capping layer 650, and to form a fill metal layer 690 over the glue layer 680. In some embodiments, the deposition processes 670 may include ALD, CVD, PVD, or combinations thereof. In some embodiments, the glue layer 680 may include TiN or TaN, and the fill metal layer 690 may include tungsten (W), cobalt (Co), ruthenium (Ru), or Iridium (Ir). In some embodiments, the fill metal layer 690 may be formed by first forming a fluorine-free tungsten (FFW) over the capping layer 650, followed by forming a low-fluorine tungsten (LFW) over the FFW, and then forming tungsten over the LFW. The fill metal layer 690 serves as the main conductive portion of the gate electrode of the gate structures 200A-200F. In some embodiments, the glue layer 680 may have a thickness in a range between about 10 angstroms and about 25 angstroms, and the FFW may be formed to be in a range between about 20 angstroms and about 40 angstroms.

FIGS. 2A-2F through FIGS. 19A-19F correspond to a first embodiment of the present disclosure. A second embodiment of the present disclosure is illustrated in FIGS. 20A-20F. For reasons of simplicity, clarity, and consistency, similar components between the first embodiment and the second embodiment are labeled the same, and the associated descriptions for these similar components may be omitted hereinafter.

One difference between the first embodiment and the second embodiment is that the gate structures 200A-200F in the second embodiment do not have the protective layer 610. As such, the N-type work function metal layer 620 is formed directly on the gate dielectric layer 430 for the gate structures 200A-200C, the N-type work function metal layer 620 is formed directly on the P-type work function metal layer 530 for the gate structures 200D-200F, and the P-type work function metal layer 530 is formed directly on the gate dielectric layer 430 for the gate structures 200D-200F.

Another difference between the first embodiment and the second embodiment is that a P-type dipole layer (rather than the N-type dipole layer) is formed over the IL 210. In some embodiments, the P-type dipole layer may include aluminum oxide ($Al_2O_3$), niobium oxide ($Nb_2O_5$), titanium oxide ($TiO_5$), boron oxide ($B_2O_3$), phosphorous pentoxide ($P_2O_5$), or phosphorous trioxide ($P_2O_3$). A dipole drive-in process similar to the dipole drive-in process 350 (see FIGS. 7A-7F) is performed in the second embodiment to form the dipole-penetrated portions 210A of the IL 210.

Yet another difference between the first embodiment and the second embodiment is that the content of the dipole material is the lowest in the gate structures 200A and 200D, and the greatest in the gate structures 200C and 200F, which is the opposite of the first embodiment. For example, for the NFETs shown in FIGS. 20A-20C, the dipole-penetrated portions 210A of the IL 210 have depths 710, 711, and 712 for the gate structures 200A, 200B, and 200C, respectively. For the PFETs shown in FIGS. 20D-20F, the dipole-penetrated portions 210A of the IL 210 have depths 720, 721, and 722 for the gate structures 200D, 200E, and 200F, respectively. Whereas the depth 370>the depth 371>the depth 372 in the first embodiment, the depth 710<the depth 711<the depth 712 in the second embodiment. Similarly, whereas the depth 380>the depth 381>the depth 382 in the first embodiment, the depth 720<the depth 721<the depth 722 in the second embodiment.

Alternatively, the differences in dipole material content in the IL 210 may manifest as the differences in concentration levels. For example, for the NFETs shown in FIGS. 20A-20C, the IL 210 of the gate structure 200A may have the lowest concentration level of the P-type dipole material, the IL 210 of the gate structure 200C may have the highest concentration level of the P-type dipole material, and the IL 210 of the gate structure 200B may have an intermediate concentration level of the P-type dipole material. For the PFETs shown in FIGS. 20D-20F, the IL 210 of the gate structure 200D may have the lowest concentration level of the P-type dipole material, the IL 210 of the gate structure 200F may have the highest concentration level of the P-type dipole material, and the IL 210 of the gate structure 200E may have an intermediate concentration level of the P-type dipole material.

The differences in the dipole material content between the gate structures 200A-200F may be achieved by configuring the distances between the P-type dipole layer and the IL 210, for example by forming hard mask layers (e.g., similar to the hard mask layers 230 and 260) selectively over different ones of the gate structures 200A-200F. For example, two hard mask layers (similar to the hard mask layers 230 and 260 of FIGS. 6C and 6F) may be formed for the gate structures 200A and 200D, one hard mask layer (similar to the hard mask layer 260 of FIGS. 6B and 6E) may be formed for the gate structures 200B and 200E, and no hard mask layers may be formed for the gate structures 200C and 200F.

Due to these differences between the first embodiment and the second embodiment discussed above, the gate structures 200A-200F of the second embodiment may be capable of tuning the threshold voltage differently than the gate structures 200A-200F of the first embodiment.

FIGS. 21A-21F illustrate a third embodiment of the present disclosure. For reasons of simplicity, clarity, and consistency, similar components between the first, second, and third embodiments are labeled the same, and the associated descriptions for these similar components may be omitted hereinafter.

Figure 21A:
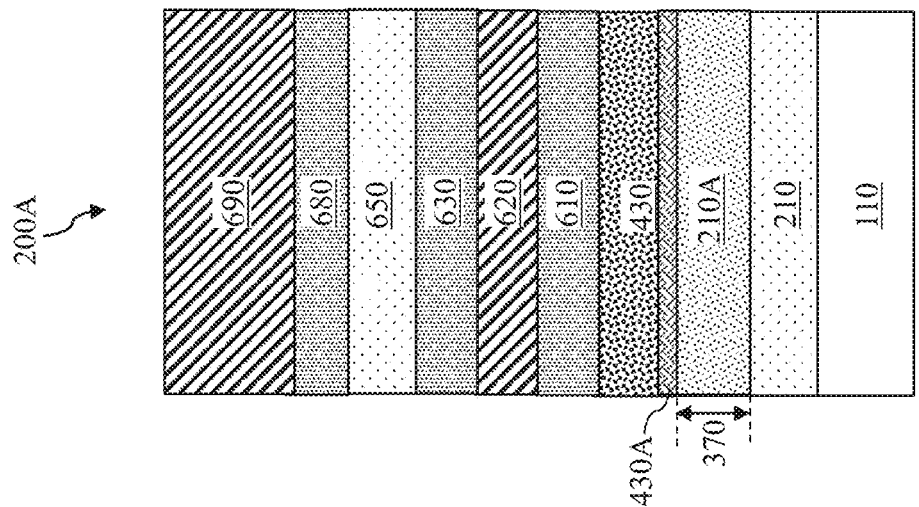
Figure 21B:
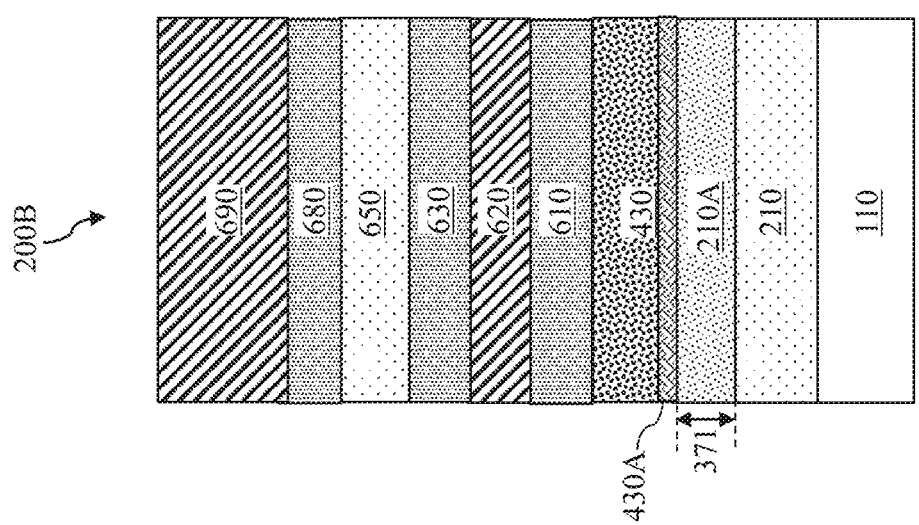
Figure 21C:
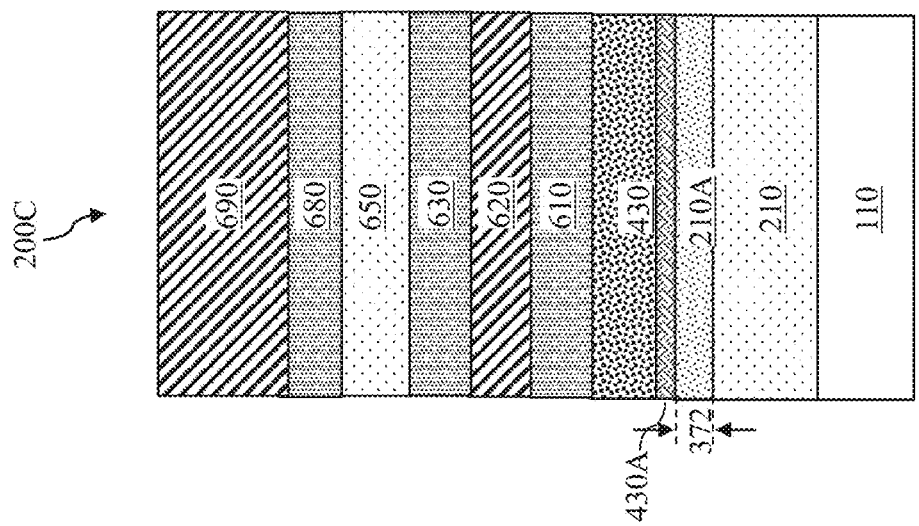

Referring to FIGS. 21A-21C, the gate structures 200A-200C of the third embodiment may be substantially similar to the gate structures 200A-200C of the first embodiment. For example, the dipole-penetrated portions 210A of the IL 210 may include N-type dipole materials, with the gate structure 200A having the greatest content of the N-type dipole material, the gate structure 200C having the lowest content of the N-type dipole material, and the gate structure 200B having an intermediate content of the N-type dipole material. This may be manifested as the depth 370>the depth 371>the depth 372, for example. Also like the first embodiment, the protective layer 610 is formed between the gate dielectric layer 430 and the N-type work function metal layer 620 for the gate structures 200A-200C in the third embodiment.

Meanwhile, the gate structures 200D-200F of the third embodiment may be substantially similar to the gate structures 200D-200F of the second embodiment. For example, the dipole-penetrated portions 210A of the IL 210 may include P-type dipole materials, with the gate structure 200F having the greatest content of the P-type dipole material, the gate structure 200D having the lowest content of the P-type dipole material, and the gate structure 200E having an immediate content of the P-type dipole material. This may be manifested as the depth 722>the depth 721>the depth 720, for example. Also like the second embodiment, the P-type work function metal layer 530 is formed directly on the gate dielectric layer 430 for the gate structures 200D-200F in the third embodiment.

It is noted that in the first and second embodiments, the NFETs and PFETs have different work function metals but have the same type of dipole layers (e.g., both having an N-type dipole material or both having a P-type dipole material). In comparison, in the third embodiment, the NFETs and PFETs have the same work function metals (e.g., layers 530, 620, and 630) but have different types of dipole materials. For example, the NFETs shown in FIGS. 21A-21C have the N-type dipole materials, and the NFETs shown in FIGS. 21D-21F have the P-type dipole materials.

Figure 22:
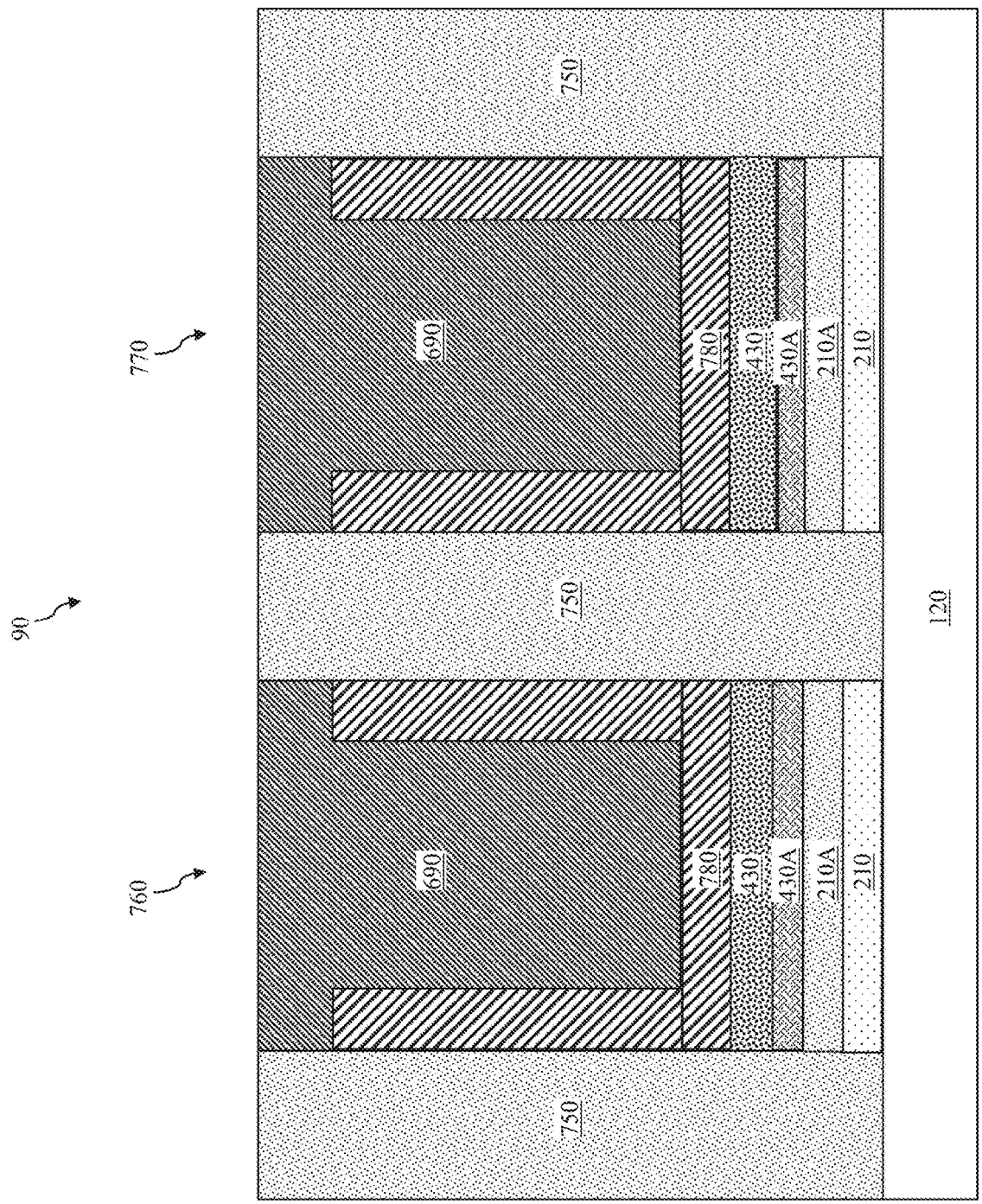

FIG. 22 illustrates a diagrammatic fragmentary cross-sectional view of a portion of the IC device 90 according to embodiments of the disclosure. Again, for reasons of clarity and consistency, similar elements appearing in FIGS. 2A-2F through 21A-21F will be labeled the same in FIG. 22.

Referring now to FIG. 22, the portion of the IC device 90 includes the fin structure 120 discussed above with reference to FIGS. 1A-1B. The portion of the IC device 90 also includes an interlayer dielectric (ILD) 750 that is formed over the fin structure 120. In some embodiments, the ILD 750 may include a dielectric material, for example silicon oxide, silicon nitride, silicon oxynitride, TEOS-formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof.

The portion of the IC device 90 further includes gate structures, for example an NFET gate structure 760 and a PFET gate structure 770. The NFET gate structure 760 may be fabricated according to one of the embodiments of the gate structures 200A/200B/200C discussed above, and the PFET gate structure 770 may be fabricated according to one of the embodiments of the gate structures 200D/200E/200F discussed above. The NFET gate structure 760 and the PFET gate structure 770 are each formed over and wraps around the fin structure 120. The NFET gate structure 760 and the PFET gate structure 770 are also separated from each other by portions of the ILD 750.

The NFET gate structure 760 and the PFET gate structure 770 each includes the IL 210. As discussed above, the IL 210 contains a dipole-penetrated portion 210A, which is formed as a result of the dipole layer being formed directly on the upper surface of the IL 210, followed by an annealing process to drive the dipole material into the IL 210. The IL 210 for the NFET gate structure 760 and the IL 210 for the PFET gate structure 770 may contain the same type of dipole materials, for example according to the first embodiment and the second embodiment discussed above with reference to FIGS. 2A-2F through 20A-20F. The IL 210 for the NFET gate structure 760 and the IL 210 for the PFET gate structure 770 may also contain different types of dipole materials, for example according to the third embodiment discussed above with reference to FIGS. 21A-21F.

The NFET gate structure 760 and the PFET gate structure 770 also include the gate dielectric layer (which may be a high-k dielectric layer) 430 that is formed over the IL 210. Note that the gate dielectric layer 430 may have a dipole-penetrated portion 430A at or near its bottom surface, due to the dipole material diffusing from the IL 210 into the gate dielectric layer 430.

The NFET gate structure 760 and the PFET gate structure 770 further includes one or more work function metal layers 780 formed over the gate dielectric layer 430. The work function metal layers 780 may include one or more of the various layers 610-680 discussed above. The work function metal layers 780 for the NFET gate structure 760 and the work function metal layers 780 for the PFET gate structure 770 may include different types or numbers of layers, for example according to the first embodiment and the second embodiment discussed above with reference to FIGS. 2A-2F through 20A-20F. The work function metal layers 780 for the NFET gate structure 760 and the work function metal layers 780 for the PFET gate structure 770 may also contain the same types and numbers of layers, for example according to the third embodiment discussed above with reference to FIGS. 21A-21F. The fill metal 690 discussed above is formed over the work function metal layer 780 and over the ILD 750. A CMP process may be performed to planarize the upper surface of the fill metal 690.

In conventional devices, the thicknesses of the work function metal layers 780 may have to be manipulated to tune the threshold voltage. For example, different thicknesses for the work function metal layers 780 may lead to different values of the threshold voltage. However, as the work function metal layers 780 get thicker, there is less room for the fill metal 690. In other words, the gate fill window is decreased, which may lead to a higher-than-optimal gate resistance. In comparison, the present disclosure can achieve threshold voltage tuning via dipole doping and mask patterning to cause different amounts of dipole material to penetrate into the interfacial layer for different types of devices. Hence, there is no need to adjust the thickness of the work function metal layers 780 to achieve different threshold voltages according to the present disclosure. As a result, the gate fill window is not unduly shortened or decreased, and there is sufficient amount of room for the fill metal 690 to form. In this manner, the gate resistance of the IC device 90 is reduced compared to the gate resistance of conventional devices.

It is understood that at least portions of the NFET gate structure 760 and PFET gate structure 770 may be formed using the gate replacement process discussed above. As a result of the gate replacement process, the work function metal layer 780 is formed to partially fill a trench, which leads to the work function metal layer 780 having a "U-shape" cross-sectional profile. It is understood that in some embodiments, such as in the high-k-last embodiments, the gate dielectric layer 430 (or even the IL 210) may also be formed to have a similar U-shaped cross-sectional profile.

Figure 23:
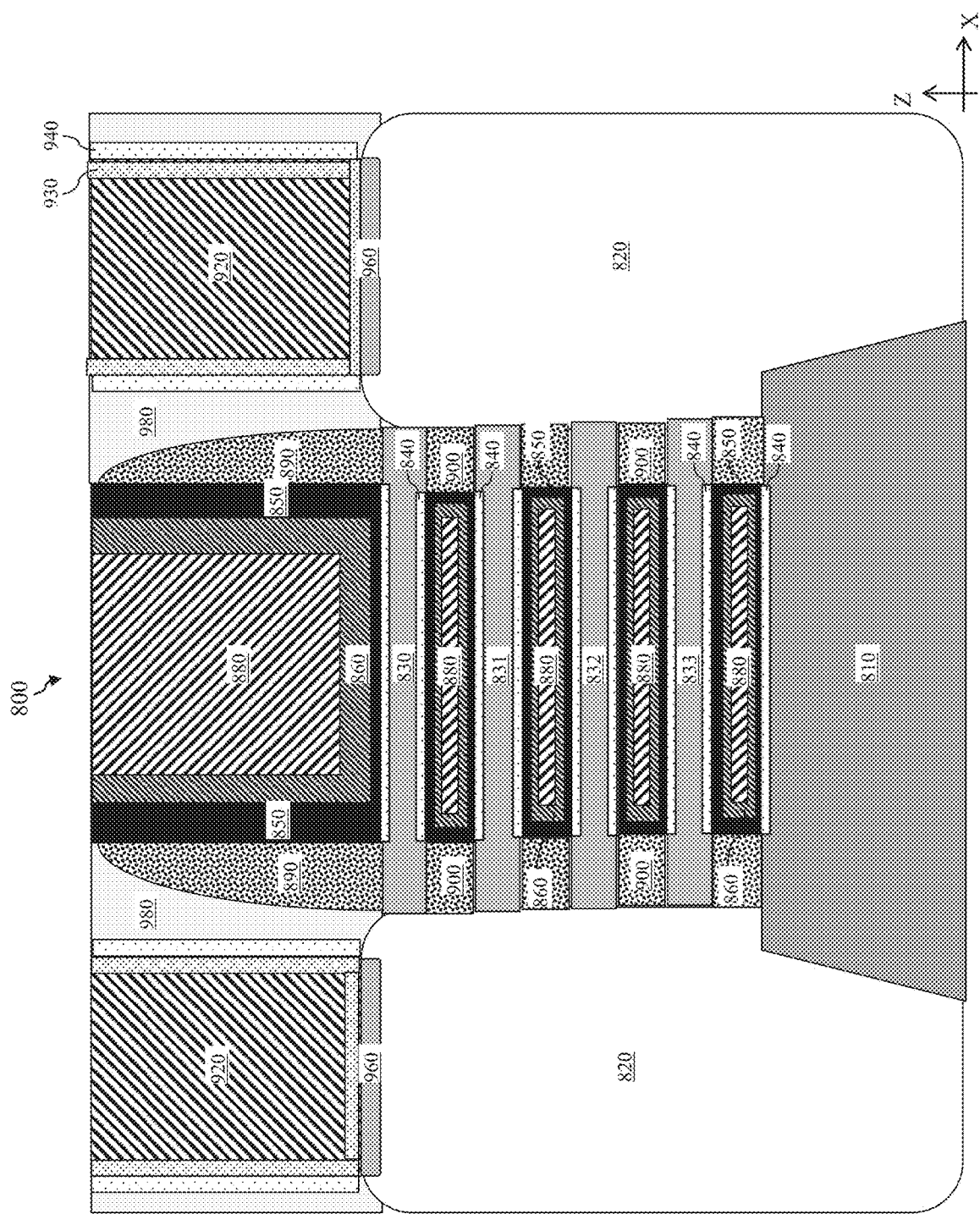

FIG. 23 illustrates a diagrammatic cross-sectional side view of a portion of an IC device 800 fabricated according to embodiments of the present disclosure, where the IC device 800 is a gate-all-around (GAA) device and may be referred to as an GAA device 800 hereinafter. It is understood that the GAA device 800 may be an NFET in some embodiments, or it may be a PFET in other embodiments.

Referring to FIG. 23, the cross-sectional view of the GAA device 800 is taken along an X-Z plane, where the X-direction (same X-direction as in FIG. 1A) is the horizontal direction, and the Z-direction (same Z-direction as in FIG. 1A) is the vertical direction. The GAA device 800 includes a fin structure 810, which may be similar to the fin structure 120 discussed above. In some embodiments, the fin structure 810 includes silicon. The GAA device 800 includes source/drain features 820, which may be similar to the source/drain features 122 discussed above. In embodiments where the GAA device 800 is an NFET, the source/drain features 820 include silicon phosphorous (SiP). In embodiments where the GAA device 800 is a PFET, the source/drain features 820 include silicon germanium (SiGe).

The GAA device 800 includes a plurality of channels, for example channels 830-833 as shown in FIG. 23. The channels 830-833 each include a semiconductive material, for example silicon or a silicon compound. The channels 830-833 are nanostructures (e.g., having sizes that are in a range of a few nanometers) and may also each have an elongated shape and extend in the X-direction. In some embodiments, the channels 830-833 may each have a nano-wire shape, a nano-sheet shape, a nano-tube shape, etc. The cross-sectional profile of the nano-wire, nano-sheet, or nano-tube may be round/circular, square, rectangular, hexagonal, elliptical, or combinations thereof.

In some embodiments, the lengths (e.g., measured in the X-direction) of the channels 830-833 may be different from each other. For example, a length of the channel 830 may be less than a length of the channel 831, which may be less than a length of the channel 832, which may be less than a length of the channel 833. In some embodiments, each of the channels 830-833 may not have uniform thicknesses. For example, the two ends of each of the channels 830-833 may be thicker than a middle portion of each of the channels 830-833. As such, it may be said that each of the channels 830-833 may have a "dog-bone" shape.

In some embodiments, a spacing (e.g., measured in the Z-direction) between the channels 830-833 (each channel from adjacent channels) is in a range between about 8 nanometers (nm) and about 12 nm. In some embodiments, a thickness (e.g., measured in the Z-direction) of each of the channels 830-833 is in a range between about 5 nm and about 8 nm. In some embodiments, a width (e.g., measured in the Y-direction of FIG. 1A) of each of the channels 830-833 is in a range between about 15 nm and about 150 nm.

A plurality of interfacial layers (ILs) 840 are formed on the upper and lower surfaces of the channels 830-833. The ILs 840 may be substantially similar to the IL 210 discussed above. For example, according to embodiments of the present disclosure, during the fabrication of the GAA device 800, a dipole layer may be formed directly on the ILs 840. Subsequently, a dipole drive-in process such as the dipole drive-in process 350 discussed above with reference to FIGS. 7A-7F may be performed to drive the metal ions of the dipole material into the ILs 840. Accordingly, the ILs 840 may each have a dipole-penetrated portion similar to the dipole-penetrated portion 210A discussed above. For reasons of simplicity, these dipole-penetrated portions are not specifically illustrated in FIG. 23. Nevertheless, it is understood that different types of GAA devices (e.g., uLVT v.s. LVT v.s. SVT) may have different content levels of the dipole material in the ILs 840, which may manifest themselves as different depths of the dipole-penetrated portions or different concentration levels of the dipole material within the ILs 840.

The GAA device 800 also includes gate structures that are disposed over and in between the channels 830-833. The gate structures may include gate dielectric layers 850, which may be similar to the gate dielectric layer 430 discussed above. In some embodiments, the gate dielectric layers 850 include a high-k gate dielectric. It is understood that the gate dielectric layers 850 may also have dipole-penetrated portions near their interfaces with the ILs 840. However, these dipole-penetrated portions are not specifically illustrated herein for reasons of simplicity. The gate structures further include one or more work function metal layers 860, which may include one or more of the layers 610-680 discussed above. In embodiments where the GAA device 800 is an NFET, the one or more work function metal layers 860 include N-type work function metal layers, such as TiAlC. In embodiments where the GAA device 800 is a PFET, the one or more work function metal layers 860 include P-type work function metal layers, such as TiN.

The gate structures also include fill metals 880, which may be similar to the fill metal 690 discussed above. In the portion of the gate structure formed over the channels 830-833, the fill metal 880 are formed over the one or more work function metal layers 860. The one or more work function metal layers 860 have a U-shape and wrap around the fill metal 880, and the gate dielectric layer 850 also has a U-shape and wrap around the one or more work function metal layers 860. In portions of the gate structures formed between the channels 830-833, the fill metal 880 is circumferentially surrounded (in the cross-sectional view) by the one or more work function metal layers 860, which is then circumferentially surrounded by the gate dielectric layer 850. It is understood that the gate structures may also include a glue layer that is formed between the one or more work function layers 860 and the fill metal 880 to increase adhesion. However, for reasons of simplicity, such a glue layer is not specifically illustrated herein.

The GAA device 800 also includes gate spacers 890 and inner spacers 900 that are disposed on sidewalls of the gate dielectric layer 850. The inner spacers 900 are also disposed between the channels 830-833. The gate spacers and the inner spacers 900 may include a dielectric material, for example a low-k material such as SiOCN, SiON, SiN, or SiOC.

The GAA device 800 further includes source/drain contacts 920 that are formed over the source/drain features 820. The source/drain contacts 920 may include a conductive material such as cobalt, copper, aluminum, tungsten, or combinations thereof. The source/drain contacts 920 are surrounded by barrier layers, for example barrier layers 930 and 940, which help prevent or reduce diffusion of materials from and into the source/drain contacts 920. In some embodiments, the barrier layer 930 includes TiN, and the barrier layer 940 includes SiN. A silicide layer 960 may also be formed between the source/drain features 820 and the source/drain contacts 920, so as to reduce the source/drain contact resistance. The silicide layer 960 may contain a metal silicide material, such as cobalt silicide in some embodiments.

The GAA device 800 further includes an interlayer dielectric (ILD) 980 that is similar to the ILD 750 discussed above. The ILD 980 provides electrical isolation between the various components of the GAA device 800 discussed above, for example between the gate structures and the source/drain contacts 920.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, the disclosures of each which are hereby incorporated by reference in their respective entireties.

Figure 24:
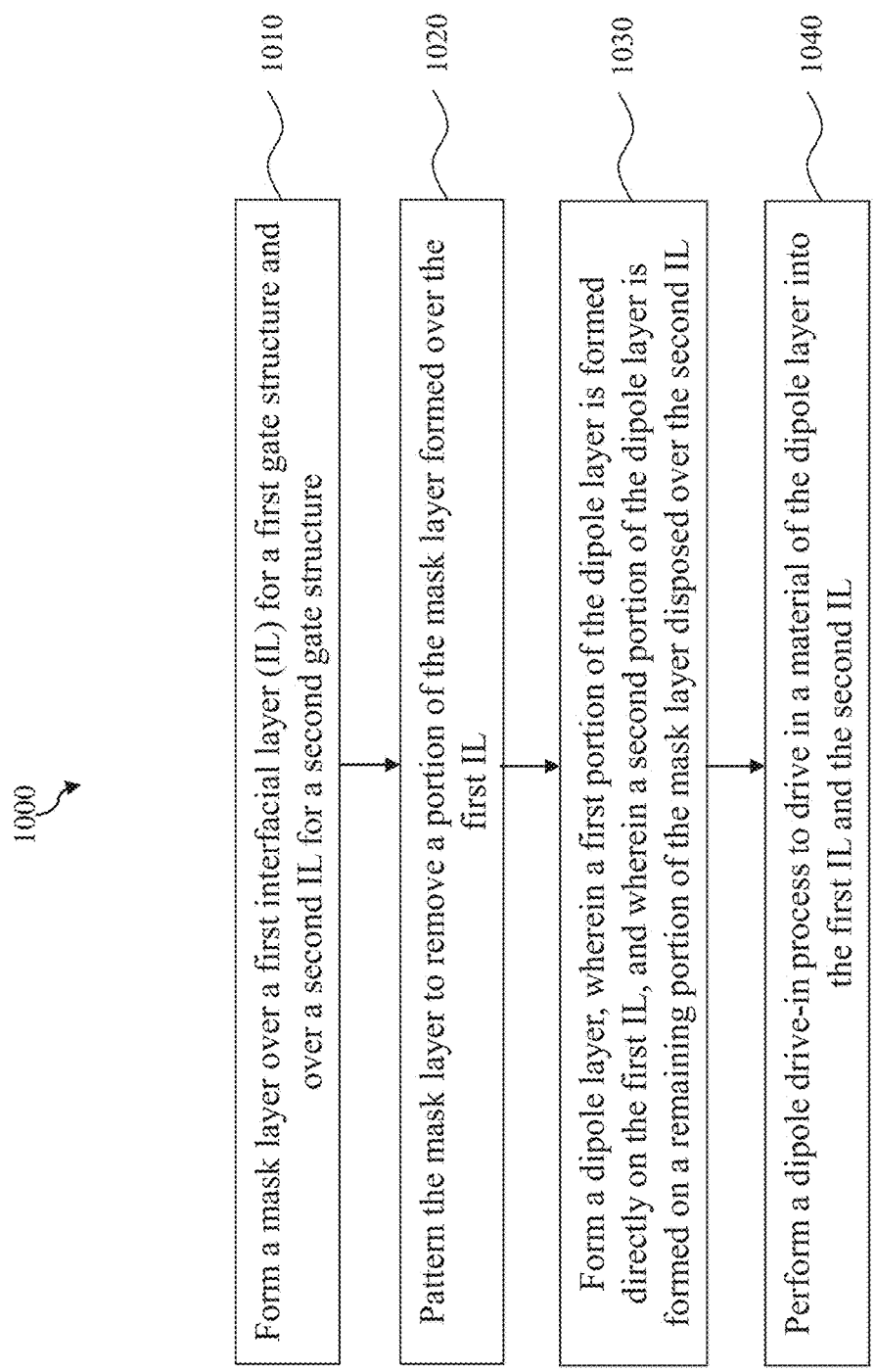
FIG. 24 is a flowchart illustrating a method of fabricating a semiconductor device according to various aspects of the present disclosure.

FIG. 24 is a flowchart illustrating a method 1000 of manufacturing a semiconductor structure. The method 1000 includes a step 1010 to form a mask layer over a first interfacial layer (IL) for a first gate structure and over a second IL for a second gate structure.

The method 1000 includes a step 1020 to pattern the mask layer to remove a portion of the mask layer formed over the first IL.

The method 1000 includes a step 1030 to form a dipole layer. A first portion of the dipole layer is formed directly on the first IL. A second portion of the dipole layer is formed on a remaining portion of the mask layer disposed over the second IL.

The method 1000 includes a step 1040 to perform a dipole drive-in process to drive in a material of the dipole layer into the first IL and the second IL.

In some embodiments, the dipole drive-in process forms a first dipole-penetrated portion in the first IL and a second dipole-penetrated portion in the second IL. The first dipole-penetrated portion has a first depth. The second dipole-penetrated portion has a second depth. The first depth is greater than the second depth.

In some embodiments, after the dipole drive-in process has been performed: the first IL has a first concentration level of the material of the dipole layer, the second IL has a second concentration level of the material of the dipole layer, and the first concentration level is greater than the second concentration level.

In some embodiments, the dipole drive-in process comprises an annealing process performed in a temperature range between about 600 degrees Celsius and 800 degrees Celsius and with a nitrogen gas.

It is understood that the method 1000 may include further steps performed before, during, or after the steps 1010-1040. For example, the method 1000 may include a step of removing the dipole layer and removing the remaining portion of the mask layer after the dipole drive-in process has been performed. The method 1000 may also include a step of forming a gate dielectric layer directly on the first IL and the second IL. The method 1000 may also include a step of forming one or more work function metal layers over the gate dielectric layer. The method 1000 may also include a step of forming a fill metal over the one or more work function metal layers. In some embodiments, the forming the one or more work function metal layers comprises: forming a first work function metal layer over the gate dielectric layer; forming a second work function metal layer over the first work function metal layer; and forming a third work function metal layer over the second work function metal layer. In some embodiments, the first work function metal layer and the third work function metal layer have same material compositions, and the second work function metal layer has a different material composition than the first work function metal layer and the third work function metal layer. In some embodiments, the first work function metal layer, the second work function metal layer, and the third work function metal layer are formed in-situ using a same deposition tool. Other steps may include formation of vias, contacts, or metal layers, etc.

In summary, the present disclosure forms dipole layers directly on the interfacial layers and performs annealing processes to cause the dipole materials to penetrate or diffuse into the interfacial layers. For different types of devices (e.g., uLVT v.s. LVT v.s. SVT devices), different lithography and patterning processes are performed to cause different amounts of dipole materials to penetrate into their respective interfacial layers. For example, a first type of device may form the dipole layer directly on the interfacial layer, and therefore the dipole concentration/depth in the interfacial layer is the greatest for the first type of device. A second type of device may form a mask layer between the dipole layer and the interfacial layer, and the presence of the mask layer leads to a lower dipole concentration/depth in the interfacial layer for the second type of device. A third type of device may form a thicker mask layer (compared to the second type of device) between the dipole layer and the interfacial layer, and the presence of the thicker mask layer leads to an even lower dipole concentration/depth in the interfacial layer for the third type of device. The different dipole concentrations/depths in the interfacial layer for different types of devices allows different threshold voltages to be achieved for these different types of devices. In addition, the dipole material may be N-type dipole materials in some embodiments or P-type dipole materials in other embodiments, which also affects the threshold voltage.

Based on the above discussions, it can be seen that the present disclosure offers advantages over conventional source/drain vias. However, it is understood that not all advantages are discussed herein, different embodiments may offer different advantages, and that no particular advantage is required for any embodiment. One advantage is that the present disclosure allows for more flexibility in turning the threshold voltage. For example, the formation of the dipole layer over the interfacial layer allows the dipole material to penetrate into the interfacial layer. The content of the dipole material in the interfacial layer affects the threshold voltage of the transistor, and therefore the dipole doping of the interfacial layer offers freedom in tuning the threshold voltage of the transistor. In addition, for different types of devices (e.g., uLVT v.s. LVT v.s. SVT devices), various patterning processes are used to cause different amounts of dipole material to penetrate into the interfacial layer for the respective devices. Again, since the amount of dipole material in the interfacial layer affects the threshold voltage, these different types of devices may be tuned to achieve different threshold voltages that are suitable or desirable for their respective applications, which further optimizes the flexibility in threshold voltage tuning. The threshold voltage tuning is further optimized by the fact that either an N-type dipole material or a P-type dipole material can be implemented.

Yet another advantage is reduced gate resistance. In more detail, conventional methods of threshold voltage tuning may merely rely on adjusting the thickness of the work function metal layers to achieve different threshold voltage. However, the thicker work function metal will lead to a smaller gate fill window (e.g., for tungsten to be formed as a part of the metal gate electrode for a high-k metal gate structure), which increases gate resistance. In comparison, the present disclosure does not need to manipulate the thicknesses of the work function metal layers to achieve different threshold voltages. Consequently, the gate fill window is larger (e.g., more room for the tungsten to fill the gate electrode), which reduces gate resistance compared to conventional gate structures. Other advantages may include compatibility with existing fabrication processes and the ease and low cost of implementation.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

One aspect of the present disclosure involves a semiconductor device. The semiconductor device includes a substrate, an interfacial layer formed over the substrate, a gate dielectric layer formed over the interfacial layer, and a metal gate electrode formed over the gate dielectric layer. The interfacial layer has a dipole-penetrated portion.

Another aspect of the present disclosure involves a semiconductor device. The semiconductor device includes a first gate structure that includes a first interfacial layer, a first gate dielectric layer disposed over the first interfacial layer, and a first gate electrode disposed over the first gate dielectric layer. The semiconductor device also includes a second gate structure that includes a second interfacial layer, a second gate dielectric layer disposed over the second interfacial layer, and a second gate electrode disposed over the second gate dielectric layer. The first interfacial layer contains a different amount of a dipole material than the second interfacial layer.

Yet another aspect of the present disclosure involves a method of fabricating a semiconductor device. The method includes: forming a mask layer over a first interfacial layer (IL) for a first gate structure and over a second IL for a second gate structure; patterning the mask layer to remove a portion of the mask layer formed over the first IL; forming a dipole layer, wherein a first portion of the dipole layer is formed directly on the first IL, and wherein a second portion of the dipole layer is formed on a remaining portion of the mask layer disposed over the second IL; and performing a dipole drive-in process to drive in a material of the dipole layer into the first IL and the second IL.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a substrate;
   an interfacial layer formed over the substrate, wherein the interfacial layer has a dipole-penetrated portion;
   a gate dielectric layer formed over the interfacial layer, wherein the gate dielectric layer has a dipole-diffused portion, and wherein a concentration of a dipole material at a bottom of the gate dielectric layer is greater than a rest of the gate dielectric layer; and
   a metal gate electrode formed over the gate dielectric layer, wherein the metal gate electrode includes, a first protective layer, a second protective layer, a work function metal layer disposed between the first protective layer and the second protective layer such that a bottom surface of the work function metal layer is in direct contact with an upper surface of the first protective layer, and a dielectric capping layer disposed over the second protective layer, wherein a bottom surface of the dielectric capping layer is in direct contact with an upper surface of the second protective layer, wherein the work function metal layer has a different material composition than the first protective layer and the second protective layer, and wherein the first protective layer and the second protective layer have a same material composition.

2. The device of claim 1, wherein a concentration of a dipole material within the dipole-penetrated portion decreases as a distance from an upper surface of the dipole-penetrated portion increases.

3. The device of claim 1, wherein the dipole-penetrated portion and the dipole-diffused portion contain yttrium oxide, magnesium oxide, niobium oxide, titanium oxide, boron oxide, phosphorous pentoxide, or phosphorous trioxide.

4. The device of claim 1, wherein:
   the metal gate electrode further includes a glue layer disposed over the dielectric capping layer, and a fill metal component disposed over the glue layer.

5. The device of claim 4, wherein the work function metal layer includes TiAlC, wherein the first protective layer and the second protective layer each include TiN, wherein the dielectric capping layer includes SiO$_2$, wherein the glue layer includes TiN or TaN, and wherein the fill metal component includes W, Co, Ru, or Ir.

6. The device of claim 1, wherein the device includes a FinFET device or a gate-all-around device, and wherein an oxygen content in the work function metal layer is less than about 1%.

7. A device, comprising:
   a substrate;
   an interfacial layer located over the substrate, wherein the interfacial layer contains a dipole material;
   a gate dielectric layer located over the interfacial layer, wherein the gate dielectric layer contains the dipole material, and wherein a concentration of the dipole material at a bottom of the gate dielectric layer is greater than a rest of the gate dielectric layer; and
   a metal-containing gate electrode located over the gate dielectric layer, wherein the metal gate electrode includes a work function metal layer disposed between a first protective layer and a second protective layer such that a bottom surface of the work function metal layer is in direct contact with an upper surface of the first protective layer, wherein the metal gate electrode further includes a dielectric capping layer disposed over the second protective layer, a glue layer disposed over the dielectric capping layer, and a fill metal layer disposed over the glue layer, wherein the work function metal layer has a different material composition than the first protective layer and the second protective layer, and wherein the first protective layer and the second protective layer have a same material composition.

8. The device of claim 7, wherein a concentration of the dipole material varies based on a depth within the interfacial layer.

9. The device of claim 7, wherein the dipole material contains yttrium oxide, magnesium oxide, niobium oxide, titanium oxide, boron oxide, phosphorous pentoxide, or phosphorous trioxide.

10. The device of claim 7, wherein:
    a bottom surface of the dielectric capping layer is in physical contact with an upper surface of the second protective layer, and a bottom surface of the glue layer is in physical contact with an upper surface of the dielectric capping layer.

11. The device of claim 10, wherein an oxygen content in the work function metal layer is less than about 1%.

12. The device of claim 11, wherein:
    the work function metal layer contains TiAlC;
    the first protective layer and the second protective layer each contain TiN;
    the dielectric capping layer includes SiO$_2$;
    the glue layer includes TiN or TaN; and
    the fill metal layer includes W, Co, Ru, or Ir.

13. The device of claim 7, wherein the device is a gate-all-around (GAA) device.

14. A device, comprising:
    a substrate;
    an interfacial layer located over the substrate, wherein the interfacial layer contains a dipole material;
    a gate dielectric layer located over the interfacial layer, wherein the gate dielectric layer contains the dipole material; and
    a metal-containing gate electrode located over the gate dielectric layer;
    wherein:
    a concentration of the dipole material varies within the interfacial layer and the gate dielectric layer;
    a peak concentration of the dipole material within the interfacial layer occurs proximate to an interface between the interfacial layer and the gate dielectric layer; and
    a peak concentration of the dipole material within the gate dielectric layer occurs at a bottom of the gate dielectric layer;
    the metal gate electrode includes a first protective layer, a second protective layer, a work function metal layer disposed between the first protective layer and the second protective layer, and a dielectric capping layer disposed over the second protective layer;
    a bottom surface of the dielectric capping layer is in direct contact with an upper surface of the second protective layer;
    a bottom surface of the work function metal layer is in direct contact with an upper surface of the first protective layer;
    the work function metal layer has a different material composition than the first protective layer and the second protective layer;

the first protective layer and the second protective layer have a same material composition; and an oxygen content in the work function metal layer is less than about 1%.

15. The device of claim 14, wherein a lowest concentration of the dipole material within the interfacial layer occurs at a point farthest away from the interface between the interfacial layer and the gate dielectric layer.

16. The device of claim 14, wherein the dipole material includes yttrium oxide, magnesium oxide.

17. The device of claim 14, wherein the dipole material includes niobium oxide, titanium oxide, boron oxide, phosphorous pentoxide, or phosphorous trioxide.

18. The device of claim 14, wherein the interfacial layer is a first interfacial layer of a first gate, the dipole material is a first dipole material, the gate dielectric layer is a first gate dielectric layer of the first gate, and the metal-containing gate electrode is a first metal-containing gate electrode of the first gate, and wherein the device further comprises a second gate that includes a second interfacial layer that contains a second dipole material, a second gate dielectric layer located over the second interfacial layer, and a second metal-containing gate electrode located over the second gate dielectric layer, and wherein the concentration of the first dipole material in the first interfacial layer is different than a concentration of the second dipole material in the second interfacial layer.

19. The device of claim 18, wherein the first gate and the second gate are associated with different threshold voltages.

20. The device of claim 18, wherein the first dipole material and the second dipole material are both N-type dipole materials or are both P-type dipole materials.

* * * * *